(12) United States Patent
Tsukamoto

(10) Patent No.: US 7,855,667 B2
(45) Date of Patent: Dec. 21, 2010

(54) SEMICONDUCTOR DEVICE AND METHOD OF CONTROLLING THE SAME

(75) Inventor: Sanroku Tsukamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 39 days.

(21) Appl. No.: 12/389,122

(22) Filed: Feb. 19, 2009

(65) Prior Publication Data
US 2010/0045496 A1 Feb. 25, 2010

(30) Foreign Application Priority Data
Mar. 4, 2008 (JP) ............................. 2008-053905

(51) Int. Cl.
*H03M 1/10* (2006.01)
(52) U.S. Cl. .................. 341/120; 341/155; 341/159
(58) Field of Classification Search .............. 341/120, 341/159
See application file for complete search history.

(56) References Cited

U.S. PATENT DOCUMENTS

| | | | | |
|---|---|---|---|---|
| 5,990,814 A | * | 11/1999 | Croman et al. ............ | 341/118 |
| 6,226,562 B1 | * | 5/2001 | Philpott ..................... | 700/117 |
| 6,420,983 B1 | * | 7/2002 | Feygin et al. ............... | 341/118 |
| 7,161,523 B1 | * | 1/2007 | Zortea ........................ | 341/158 |
| 7,511,645 B1 | * | 3/2009 | Ranucci ..................... | 341/120 |

FOREIGN PATENT DOCUMENTS

JP 2001-516982 A 10/2001
WO WO 99/13583 A1 3/1999

OTHER PUBLICATIONS

Yuko Tamba et al.; A CMOS 6b 500MSample/s ADC for a Hard Disk Drive Read Channel; IEEE International Solid-State Circuits Conference; vol. XLII; pp. 324-325; Feb. 15, 1999.
D. Wouter et al.; "A Self Calibration Technique for Monolithic High-Resolution D/A Converters"; IEEE Journal of Solid-State Circuits; vol. 24; pp. 1517-1522; Dec. 1989.
Sanroku Tsukamoto et al.; "A CMOS 6b 200Msample/s, 3 V-supply A/D converter for a PRML read channel LSI"; IEEE Journal of Solid-State Circuits; vol. 31; pp. 1831-1836; Nov. 1996.

* cited by examiner

*Primary Examiner*—Khai M Nguyen
(74) *Attorney, Agent, or Firm*—Arent Fox LLP

(57) ABSTRACT

A semiconductor device is described which includes a first comparator judging the level of an input signal based on a first judgment value, a second comparator judging the level of the input signal based on a second judgment value, and a calibrator outputting a control signal for starting the calibration of the second judgment value in the case that the calibration of the first judgment value is ended.

9 Claims, 21 Drawing Sheets

FIG. 2

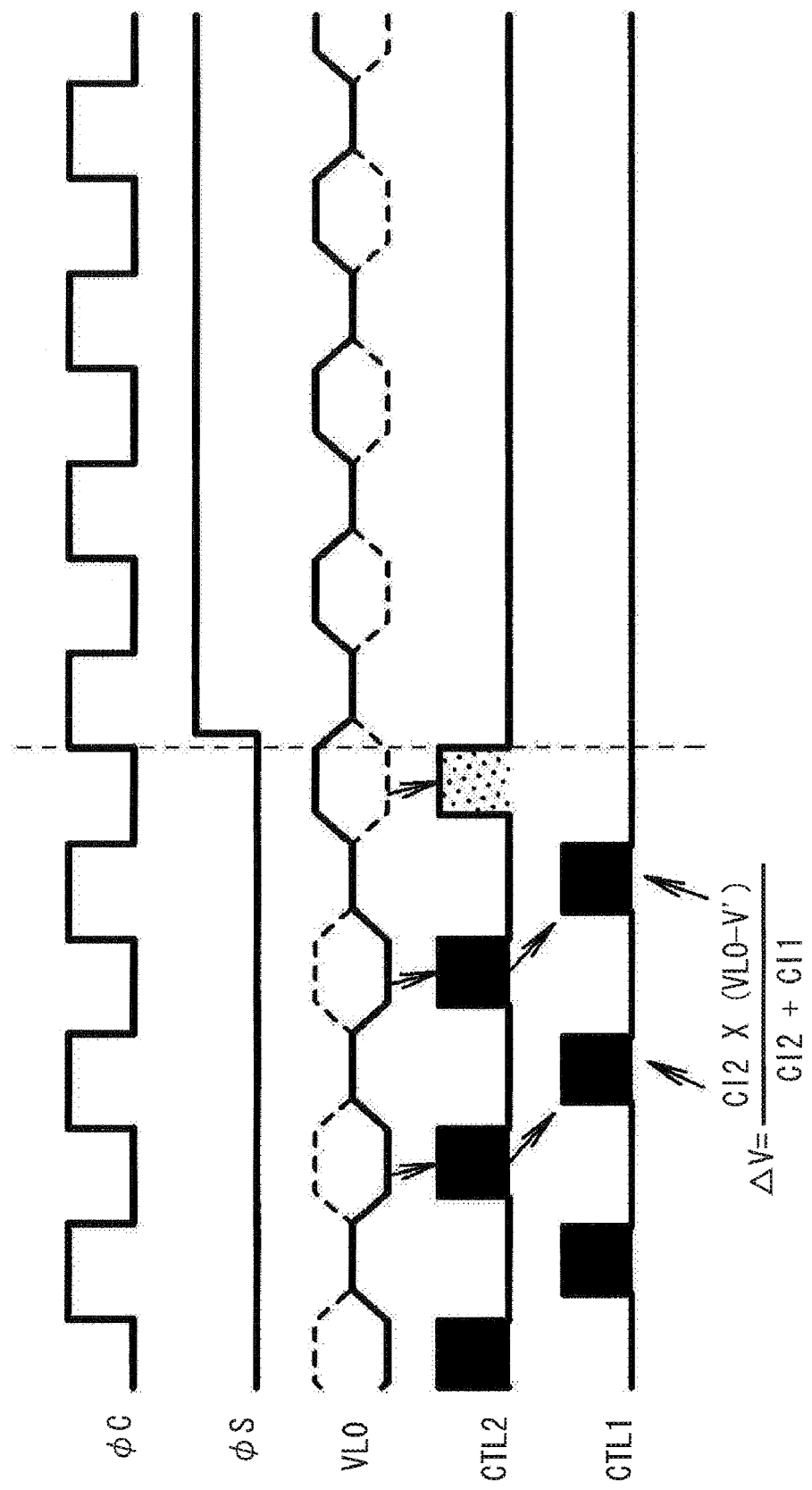

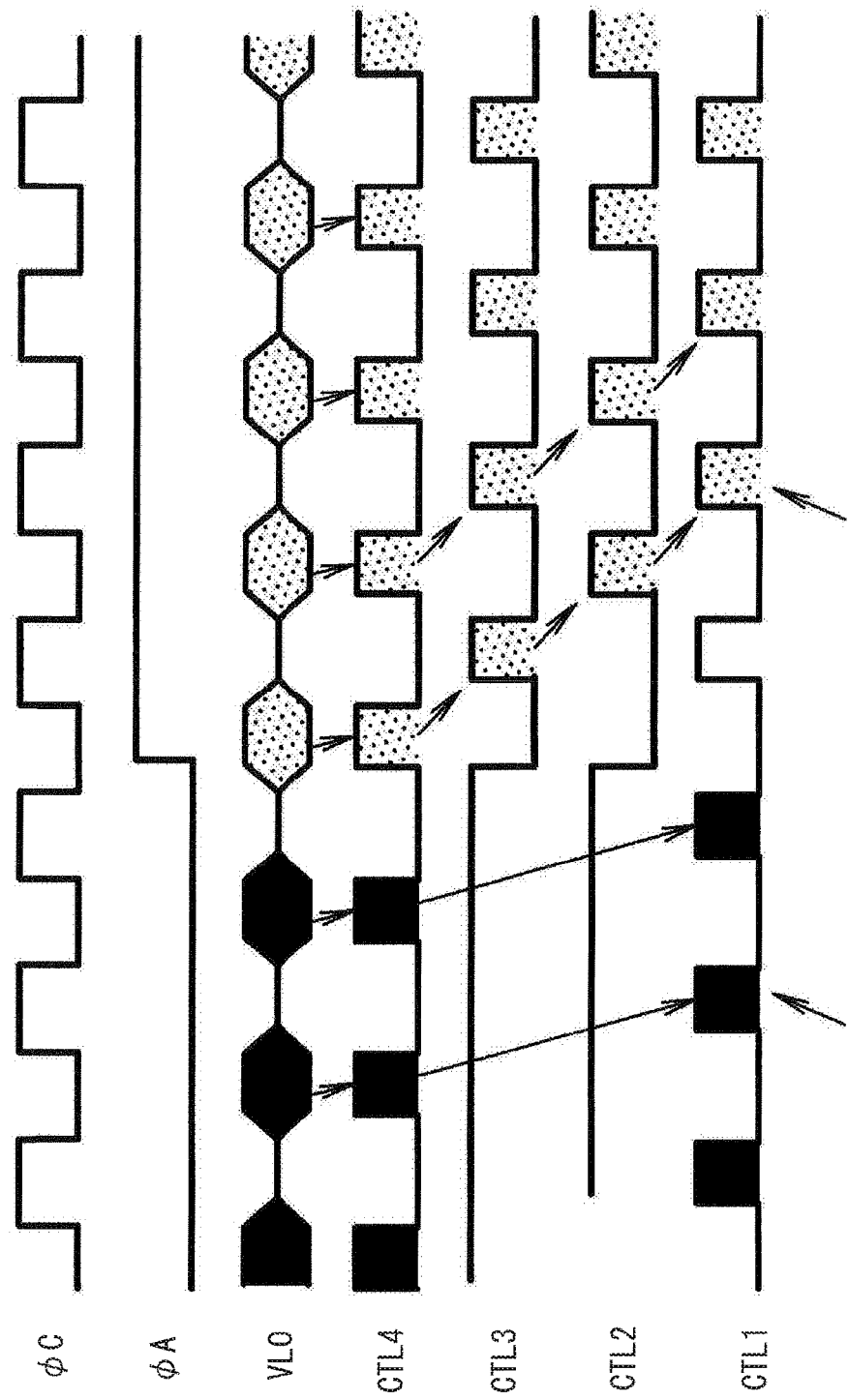

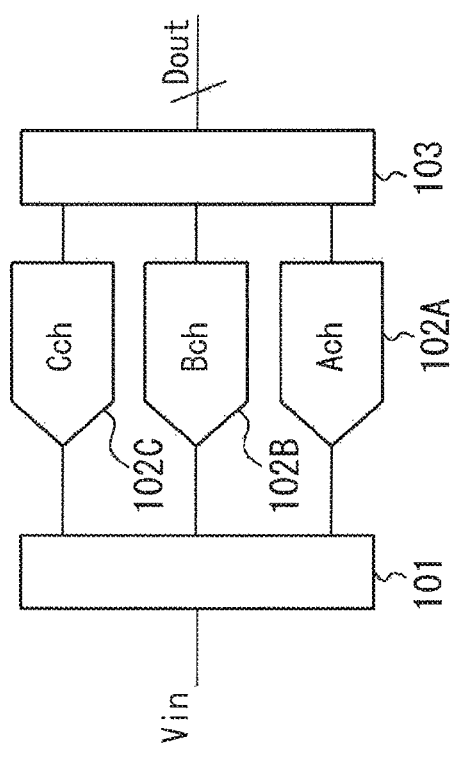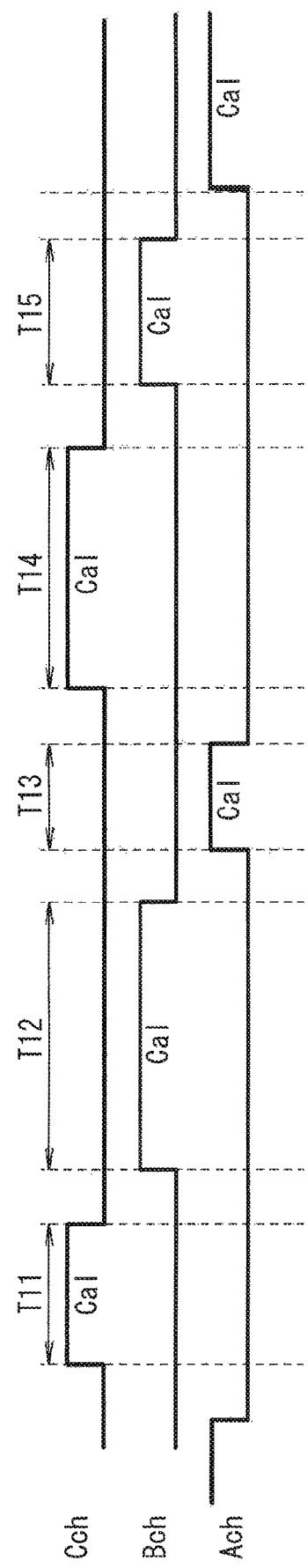
FIG. 19A
FIG. 19B

SEMICONDUCTOR DEVICE AND METHOD OF CONTROLLING THE SAME

CROSS-REFERENCE TO RELATED APPLICATIONS

This application claims the benefit of priority of Japanese Patent Application No. 2008-53905 filed on Mar.4, 2008, the entire contents of which are incorporated herein by reference.

FIELD

The present application relates to a semiconductor device and a method of controlling the semiconductor device.

BACKGROUND

A typical A/D converter includes a circuit (comparator) that performs a magnitude comparison between the levels of two analog signal voltages and outputs the result of the comparison as a digital value. The comparator includes a preamplifier section that generally amplifies its input and a latch section that judges whether the logic level of the input is 1 or 0. The comparator typically has an offset due to the variation in the characteristics of devices. This offset limits the accuracy of the comparator. Accordingly, calibration is performed in the background to cancel the offset.

As another typical offset canceling method, dynamic offset calibration is available in which the offset is canceled using a digital/analog converter (D/A converter) by operating a comparator under the similar conditions as those in the actual operation mode. In the dynamic offset calibration, after the completion of calibration is detected, the calibration is ended.

In a D/A converter that performs calibration for multiple current source cells in the background, a typical technology similar to that described above is available. According to this technology, errors in the accuracy of individual current source cells are canceled by providing redundancy in the number of the current source cells and by sequentially performing calibration for the redundant current source cells.

The typical dynamic offset calibration is performed under similar conditions (clock frequency and duty ratio) as those in normal operation. Since the clock frequency is generally proportional to the power source current, the power source voltage actually applied to the comparator differs depending on the resistance of the power source wiring or the like. Hence, the generation of offset or the like in the comparator is also affected. If calibration is performed under the similar conditions as those in the case of a normal comparison operation, the offset under the operation conditions is canceled properly.

In the typical background calibration, the circuit to be subjected to calibration is switched every preset specific period. When the comparator in which calibration is performed is switched, its internal circuit operates or a circuit that generates a switching signal for switching the comparator operates, whereby the source current is changed. Since the switching signal itself operates, the source current is changed.

The change in the source current affects the clock for analog signal operation, thereby eventually causing the clock timing to change. In the typical background calibration, the change in the power source current due to the switching operation of the target of calibration affects the clock generated at a constant period, and the clock timing is changed occasionally.

The change in the clock timing is a timing error. In the case that a dynamic analog signal is processed, the amount of the voltage changed in the error time becomes an error voltage. If a change in the clock timing occurs, the conversion output in the A/D conversion operation also has an error. The effect due to the change in the clock timing is produced significantly in a high input frequency range. As a result, spurs occurs at a specific frequency depending on a specific period at which the target of calibration is switched, and the characteristics are degraded.

SUMMARY

According to one aspect of the embodiments, a semiconductor device includes a first comparator judging the level of an input signal based on a first judgment value, a second comparator judging the level of the input signal based on a second judgment value, and a calibrator outputting a control signal for starting the calibration of the second judgment value in the case that the calibration of the first judgment value is ended.

Aspects and/or advantages will be set forth in part in the description which follows. However, it will be understood by those of ordinary skill in the art that variations and modification of such aspects described herein may be made without departing from the scope thereof. Other aspects will be apparent to those skilled in the art from a practice thereof.

BRIEF DESCRIPTION OF THE DRAWINGS

These and/or other aspects and advantages will become apparent and more readily appreciated from the following description of the embodiments, taken in conjunction with the accompanying drawings of which:

FIG. 2 illustrates an example of calibration setting in the first embodiment in FIG. 1

FIG. 8 is a timing chart showing the operation of the switch control circuit in FIG. 7;

FIG. 11 illustrates a timing chart showing the operation of the switch control circuit in FIG. 10;

FIG. 19A illustrates a second embodiment;

FIG. 19B illustrates a timing chart showing the operation of the second embodiment in FIG. 19A;

DETAILED DESCRIPTION OF THE EMBODIMENTS

Figure 1:
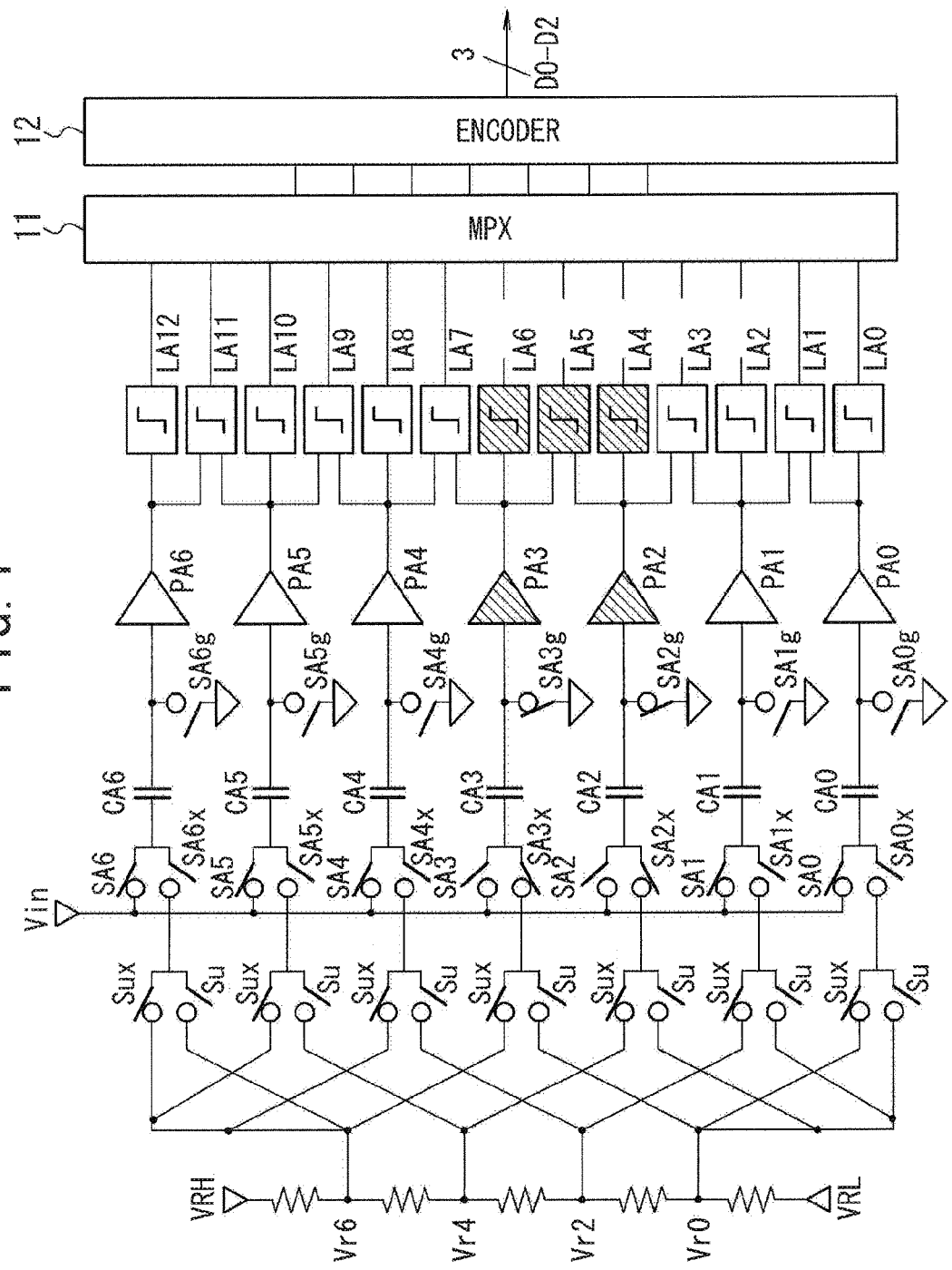
FIG. 1 illustrates a parallel A/D converter, in accordance with one embodiment.

Reference will now be made in detail to the embodiments, examples of which are illustrated in the accompanying drawings, wherein like reference numerals refer to the like elements throughout. The embodiments are described below by referring to the figures.

Background calibration will be described below referring to FIG. 1.

FIG. 1 illustrates a parallel A/D converter, an example of a semiconductor device according to a first embodiment. The parallel A/D converter converts an analog input signal Vin input thereto into a 3-bit digital signal (D0 to D2). FIG. 1 illustrates a single configuration of the converter as an example.

As shown in FIG. 1, switches Su and Sux selectively output reference voltages Vr0, Vr2, ..., Vr6 obtained by dividing the voltage between a voltage VRH and a voltage VRL (for example, by resistive voltage division). In the case that calibration is performed sequentially in the direction of the arrangement of preamplifiers, PA0, PA1, ..., PA6, the switch Su is opened and the switch Sux is closed. Conversely, in the case that calibration is performed sequentially in the direction of the arrangement of the preamplifiers, PA6, PA5, ..., PA0, the switch Su is closed and the switch Sux is opened.

Switches SAk and SAkx (k=0 to 6) are switches that perform switching so that the reference voltage or the analog input signal Vin is supplied to a capacitor CAk coupled to the preamplifier PAk. To the capacitor CAk, the reference voltage is supplied via the switch SAkx during calibration, and the analog input signal Vin is supplied via the switch SAk during normal operation.

The preamplifier PAk amplifies the input signal and outputs an amplified signal. The input terminal of the preamplifier PAk is coupled to the capacitor CAk, and a common-mode potential Vcm may be supplied to the input terminal via a switch SAkg.

Latches LA0 to LA12 judge the digital logic level (1 or 0) of the analog input signal Vin. The latch LA (2k) coupled to the preamplifier PAk performs a magnitude comparison between the reference voltage and the analog input signal Vin based on the output of the preamplifier coupled thereto to judge the digital logic level. An interpolation latch LA (2k+1) (k=0 to 5 for interpolation latches) coupled to the output terminals of two preamplifiers PAk and PA (k+1) judges the digital logic level based on the average of the outputs of the preamplifiers coupled thereto.

A coupling section 11 controls the coupling between the latches LA0 to LA12 and an encoder 12. The coupling section 11 comprises a multiplexer having multiple switches. The encoder 12 decodes the outputs of the latches LA0 to LA12 selectively supplied via the coupling section 11 and outputs the 3-bit digital signal (D0 to D2).

The parallel A/D converter in FIG. 1 performs calibration in the background while performing normal operation. While seven preamplifiers (PA0-PA6) and 13 latches (LA0-LA12) are shown, the number of preamplifiers and latches may differ depending on the bit resolution.

As further shown in FIG. 1, for example, more than the numbers of the preamplifiers and the latches may be provided so that while one group of preamplifiers and latches performs calibration, the other groups of preamplifiers and latches, not performing calibration, perform normal operation and convert the analog input signal Vin into the 3-bit digital signal.

During calibration, a reference voltage Vref is supplied via the switch SAkx to the capacitor CAk (having a capacitance C) coupled to the preamplifier PAk. A charge C (Vref-GND) is stored in the capacitor CAk by setting the coupling point of the capacitor CAk and the preamplifier PAk at the common-mode potential Vcm (the ground potential GND in this configuration) using the switch SAkg. The coupling from the coupling point of the capacitor CAk and the preamplifier PAk to the common-mode potential Vcm is then cut off by turning off the switch SAkg. Hence, the charge between the capacitor CAk and the preamplifier PAk is maintained, and as a result, the reference voltage Vref is stored in the capacitor CAk.

During calibration, the preamplifier PAk amplifies the common-mode potential Vcm and transmits an amplified output signal to the latch LA. The latch LA performs offset canceling based on the value of the signal, whereby the output of the preamplifier when the common-mode potential Vcm is input is set as a threshold voltage.

Hence, the offset in the range from the preamplifier PAk to the latch LA is canceled. Furthermore, hereafter, in the normal operation state, the analog input signal Vin is supplied to the capacitor CAk via the switch SAk, whereby the difference voltage (Vref-Vin) is transmitted to the preamplifier. Hence, the comparison between the stored reference voltage Vref and the analog input signal Vin is attained.

Figure 2:
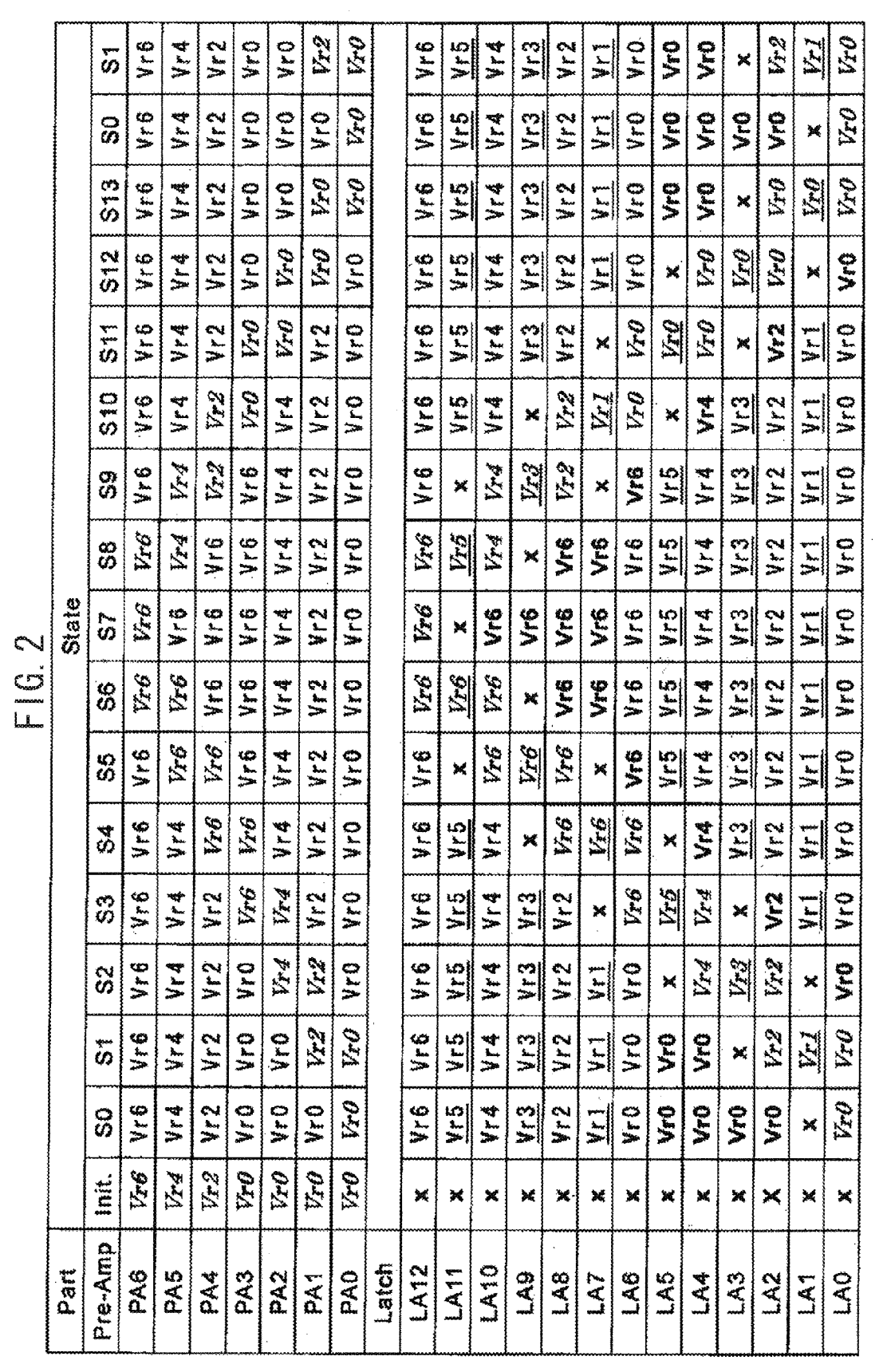

An example of the calibration setting of the parallel A/D converter in FIG. 1 is illustrated in FIG. 2.

FIG. 2 illustrates the reference voltages input to the preamplifiers PA0 to PA6 in FIG. 1, the states of the preamplifiers PA0 to PA6 in FIG. 1 and the judgment points of the latches LA0 to LA12 in FIG. 1.

As shown in FIG. 2, a state indicated in italic characters represents that calibration is being performed, and a state indicated in bold characters represents an uncoupled state. In particular, "x" represents an invalid state. A state indicated in underlined characters represents that the reference voltage is a virtual reference voltage. The state in FIG. 1 corresponds to state S3 in FIG. 2. In this state, the preamplifiers PA2 and PA3 and the latches LA4 to LA6 perform calibration, and the preamplifiers PA0, PA1, and PA4 to PA6 and the latches LA0, LA1 and LA8 to LA12 perform normal operation.

Instead of background calibration in which each state in FIG. 2 is sequentially shifted every predetermined specific period (for example, every several tens of clock cycles), calibration according to the first embodiment may be performed such that state shifting to the next state is not performed every predetermined specific period, but the end of calibration is judged, and after the calibration is ended, the state is immediately shifted to the next state and calibration is performed.

Figure 3A:
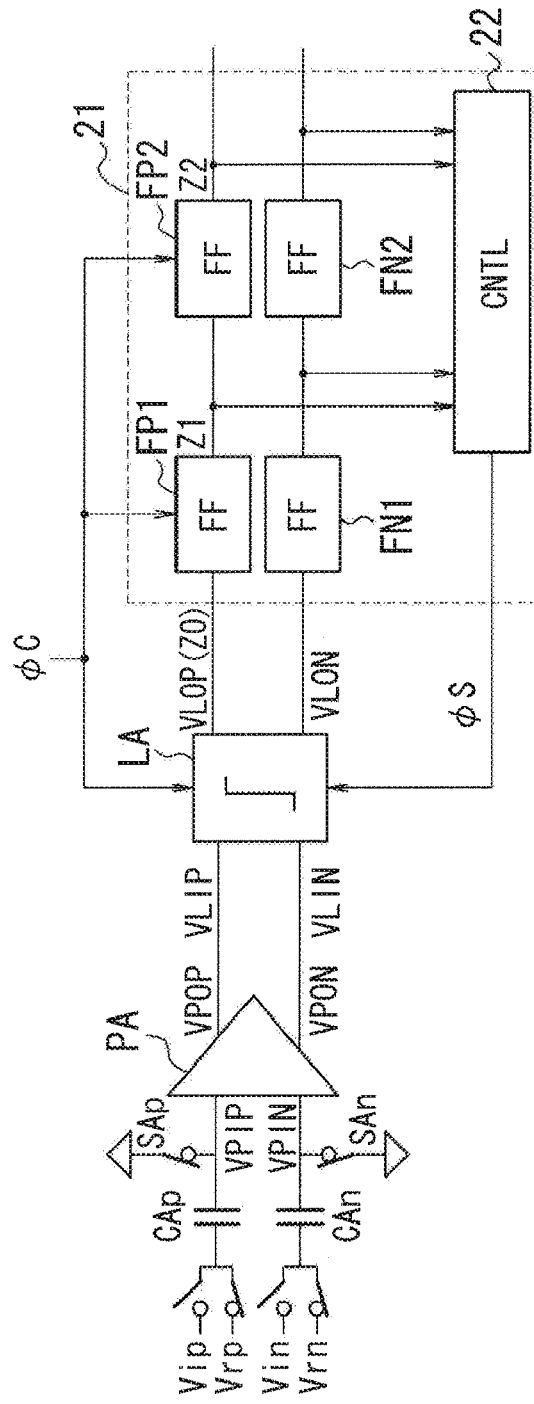
FIG. 3A illustrates a circuit configuration example of a parallel A/D converter according to the first embodiment in FIG. 1.

FIG. 3A schematically shows a circuit configuration example of the parallel A/D converter according to the first embodiment. For the convenience of description, FIG. 3A shows, as an example, part of the preamplifiers and the latches constituting the parallel A/D converter, i.e., a portion that includes one preamplifier and one latch coupled thereto and is configured by applying a differential circuit.

According to FIG. 3A, a positive-phase analog input signal Vip or a positive-phase reference voltage Vrp is supplied via a switch to a capacitor CAp, and a negative-phase analog input signal Vin or a negative-phase reference voltage Vrn is supplied via a switch to a capacitor Can. The positive-phase input VPIP of a preamplifier PA is coupled to the capacitor CAp, and the common-mode potential Vcm may be supplied thereto via a switch SAp. The negative-phase input VPIN of the preamplifier PA is coupled to the capacitor CAn, and the common-mode potential Vcm may be supplied thereto via a switch SAn.

The positive-phase output VPOP of the preamplifier PA is input to the positive-phase input VLIP of a latch LA, and the negative-phase output VPON of the preamplifier PA is input to the negative-phase input VLIN of the latch LA. A clock signal $\phi C$ and a calibration end instruction signal $\phi S$ are supplied as control signals to the latch LA. The calibration end instruction signal $\phi S$ is a signal instructing the end of the offset calibration being performed.

A calibration control circuit 21 is a circuit for judging the end of calibration. The calibration control circuit 21 judges whether calibration has been ended based on the outputs VLOP and VLON of the latch LA and outputs the calibration end instruction signal $\phi S$ depending on the result of the judgment.

The calibration control circuit 21 has, for example, flip-flops FP1, FP2, FN1 and FN2 and an internal control circuit 22.

The positive-phase output VLOP (Z0) is input to the flip-flop FP1, and the output Z1 of the flip-flop FP1 is input to the flip-flop FP2. Similarly, the negative-phase output VLON is input to the flip-flop FN1, and the output of the flip-flop FN1 is input to the flip-flop FN2. The clock signal $\phi C$ is supplied to the flip-flops FP1, FP2, FN1 and FN2, and the flip-flops operate based on the clock signal.

The internal control circuit 22 compares the outputs of the flip-flops FP1 and FP2 and/or the outputs of the flip-flops FN1 and FN2 and judges whether calibration has ended depending on the result of the comparison. The internal control circuit 22 outputs the calibration end instruction signal $\phi S$ corresponding to the result of the comparison. As depicted in FIG. 3A, for example, upon detecting that the outputs of the flip-flops FP1 and FP2 may be different from each other, the internal control circuit 22 judges that calibration has been ended and asserts the calibration end instruction signal S.

Figure 3B:
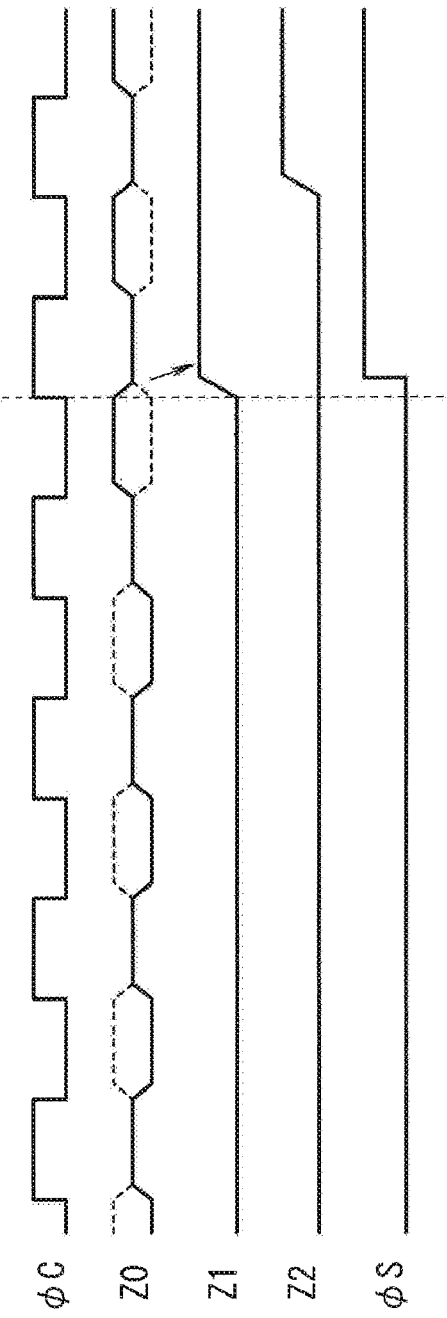
FIG. 3B illustrates a timing chart showing the operation of the calibration control circuit depicted in FIG. 3A.

FIG. 3B is a timing chart showing the operation of the calibration control circuit 21 in FIG. 3A. The flip-flop FP1 captures the positive-phase output VLOP (Z0) of the latch LA and outputs its output as the output Z1 in synchronization with the rising edge of the clock signal $\phi C$. Similarly, the flip-flop FP2 captures the output Z1 of the flip-flop FP1 and outputs its output as the output Z2 in synchronization with the rising edge of the clock signal $\phi C$.

As shown in FIGS. 3A and 3B, during calibration, when the voltage exceeds a convergence point at which the offset is canceled, the result of the judgment using the latch LA is switched, and its output (Z0) is inverted. Hence, the output Z1 of the flip-flop FP1 is changed, and the output Z2 of the flip-flop FP2 may be changed one clock cycle after the change. In this case, the outputs Z1 and Z2 of the flip-flops FP1 and FP2 become different from each other, and the internal control circuit 22 detects that the result of the judgment using the latch LA has been switched. Consequently, the internal control circuit 22 judges that calibration has been ended and asserts the calibration end instruction signal $\phi S$.

Figure 4:
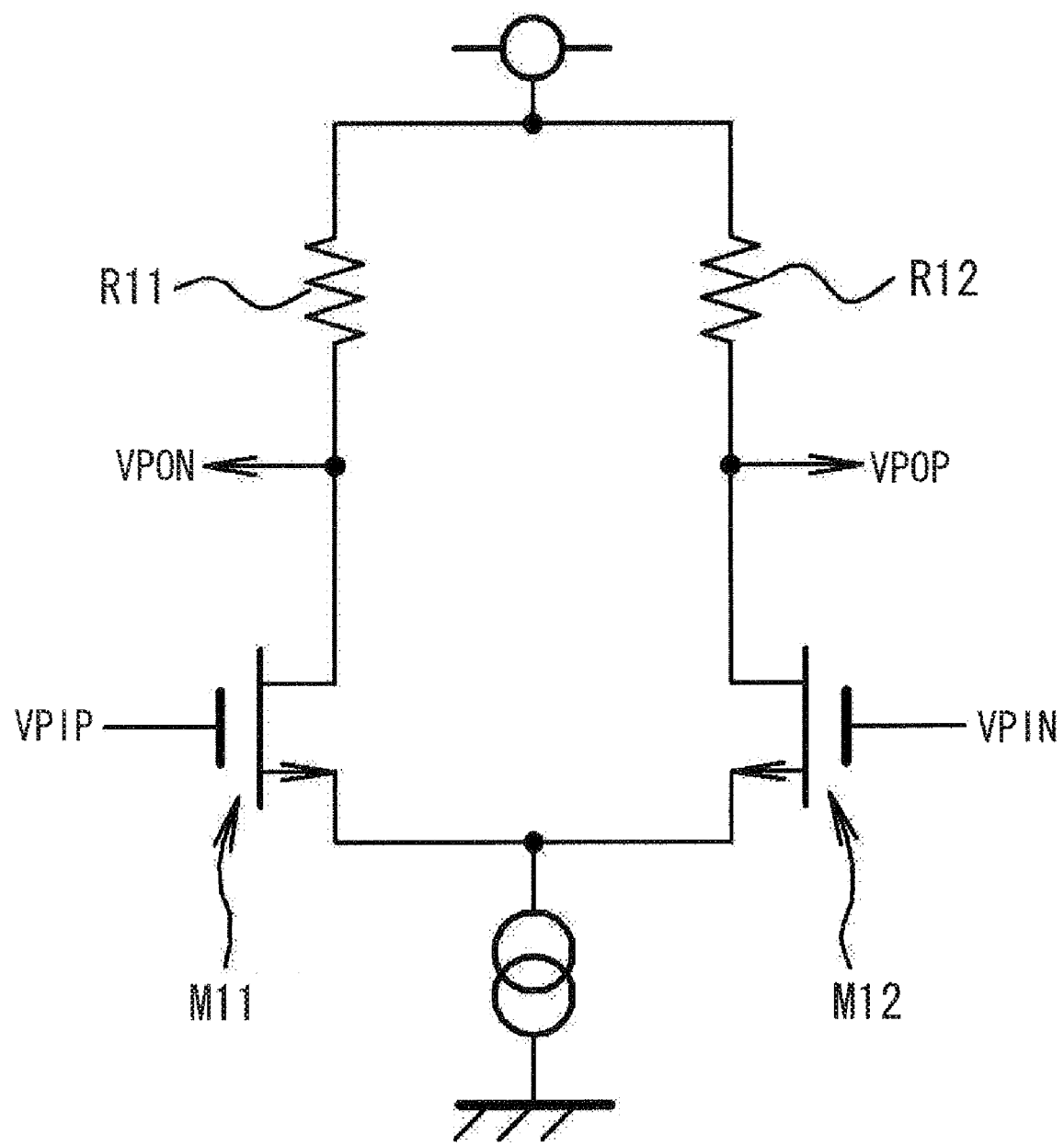
FIG. 4 illustrates an example of a preamplifier according to the first embodiment in FIG. 1.

FIG. 4 is a circuit diagram showing a configuration example of the preamplifier PA in FIG. 3A according to this embodiment.

The preamplifier PA has resistors R11 and R12 and NMOS transistors M11 and M12. The resistors R11 and R12 serve as load devices, and the NMOS transistors M11 and M12 serve as driving devices.

One terminal of each of the resistors R11 and R12 is coupled to a power source voltage (VDD), and the sources of the NMOS transistors M1 and M12 are coupled to a current source. The positive-phase input signal VPIP is supplied to the gate of the NMOS transistor M11 and the drain thereof is coupled to the other terminal of the resistor R11. Similarly, the negative-phase input signal VPIN is supplied to the gate of the NMOS transistor M12 and the drain thereof is coupled to the other terminal of the resistor R12. The preamplifier PA outputs the voltage at the coupling point of the drain of the NMOS transistor M11 and the other terminal of the resistor R11 as the negative-phase output signal VPON and also outputs the voltage at the coupling point of the drain of the NMOS transistor M12 and the other terminal of the resistor R12 as the positive-phase output signal VPOP.

The configuration of the preamplifier in FIG. 4 is an example, and this embodiment is not limited to this configuration. For example, a general amplifier that amplifies an input signal and outputs an amplified signal, and/or other amplifier configurations may be used.

Figure 5:
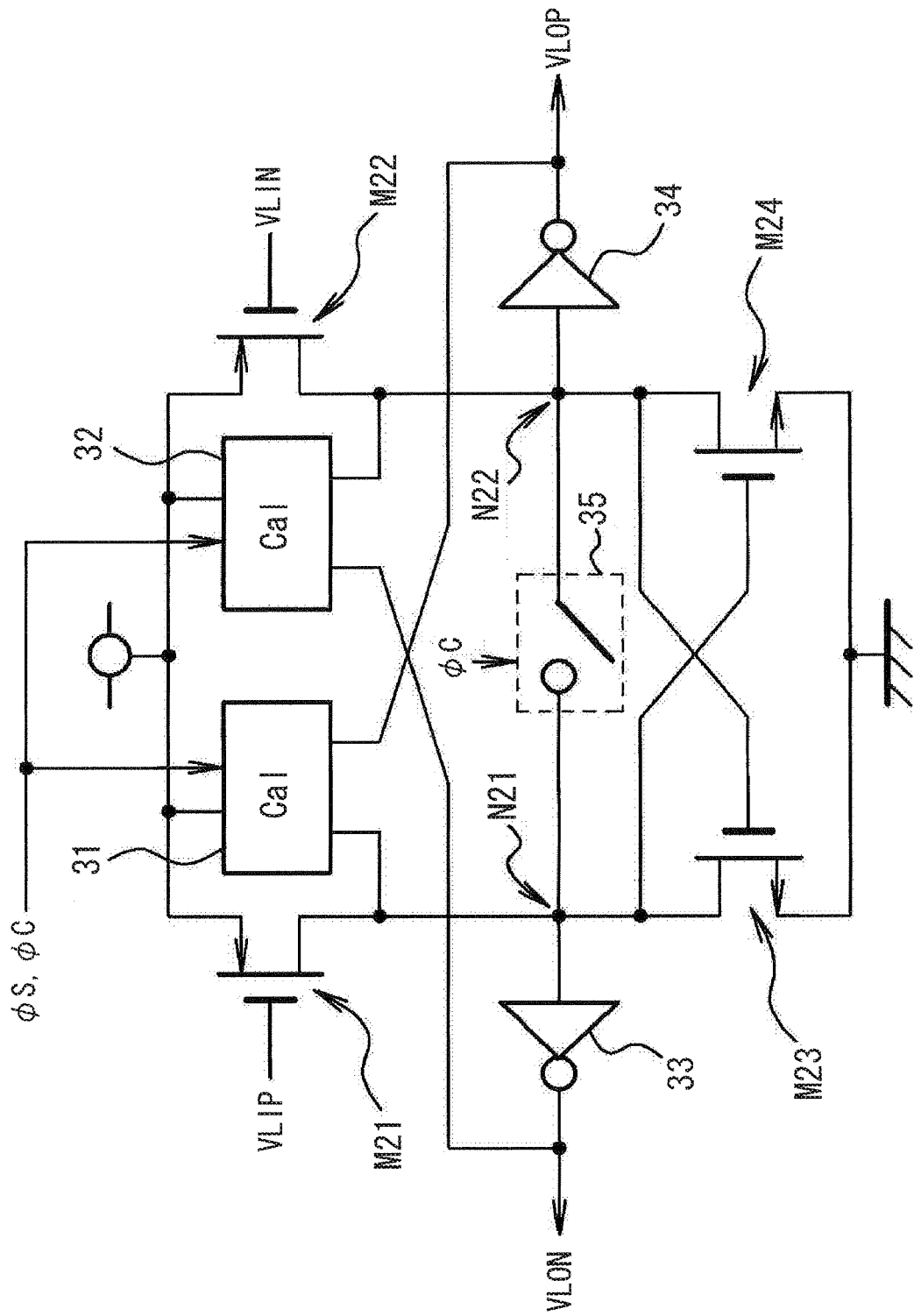
FIG. 5 illustrates an example of a latch according to the first embodiment in FIG. 1.

FIG. 5 is a circuit diagram showing a configuration example of the latch LA in FIG. 3A according to this embodiment. The latch LA has PMOS transistors M21 and M22, NMOS transistors M23 and M24, calibration circuits 31 and 32, inverters 33 and 34, and a switch 35.

The PMOS transistors M21 and M22 serve as driving devices. The source of the PMOS transistor M21 is coupled to the power source voltage (VDD), the drain thereof is coupled to a node N21, and the positive-phase input signal VLIP is supplied to the gate thereof. The source of the PMOS transistor M22 is coupled to the power source voltage (VDD), the drain thereof is coupled to a node N22, and the negative-phase input signal VLIN is supplied to the gate thereof.

The NMOS transistors M23 and M24 serve as load devices. The drain of the NMOS transistor 23 is coupled to the node N21, the gate thereof is coupled to the node N22, and the source thereof is grounded. The drain of the NMOS transistor M24 is coupled to the node N22, the gate thereof is coupled to the node N21, and the source thereof is grounded.

The input terminal of the inverter 33 is coupled to the node N21, and the inverter 33 outputs the negative-phase output signal VLON based on the logic level of the node N21. The input terminal of the inverter 34 is coupled to the node N22, and the inverter 34 outputs the positive-phase output signal VLOP based on the logic level of the node N22.

The switch 35 is a reset switch and is controlled to close when the clock signal $\phi C$ is high (H) and to open when the clock signal $\phi C$ is low (L). Hence, the latch LA is reset when the clock signal $\phi C$ is H (the switch 35 is ON) and performs a judgment operation when the clock signal $\phi C$ is L (the switch 35 is OFF).

Figure 6:
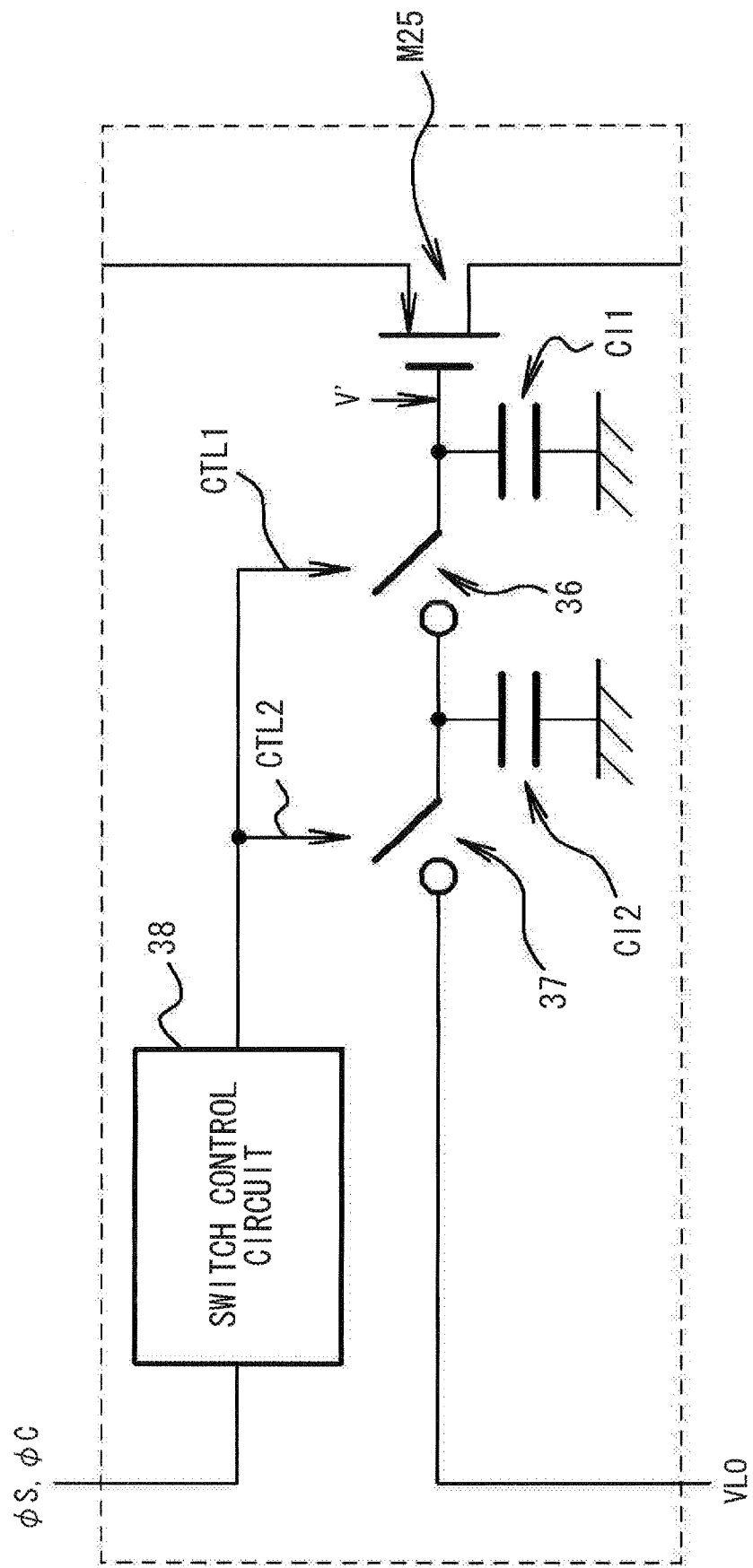
FIG. 6 illustrates an example of a calibration circuit according to the first embodiment in FIG. 1.

FIG. 6 is a circuit diagram showing a configuration example of the calibration circuits 31 and 32 in FIG. 5. The calibration circuit has a PMOS transistor M25 for calibration, switches 36 and 37, capacitors CI1 and CI2, and a switch control circuit 38.

The drain of the PMOS transistor M25 outputs a calibration current. The source of the PMOS transistor M25 is coupled to the source (the power source voltage (VDD)) of the PMOS transistor M21 or M22 corresponding thereto, and the drain thereof is coupled to the drain of the PMOS transistor M21 or M22 corresponding thereto.

The switches 36 and 37 are coupled in series between a negative feedback node VLO and the gate of the PMOS transistor M25 so that one node of each switch is on the side of the negative feedback node VLO and the other node thereof is on the gate side of the PMOS transistor M25. Each of the capacitors CI1 and CI2 is coupled between the other node of each of the switches 36 and 37 and the ground. The capacitance value of the capacitor CI1 may be larger than that of the capacitor CI2. The negative feedback node VLO is coupled to the output terminal of the inverter 34 or 33 corresponding thereto.

The switch 36 is ON/OFF controlled using a switch control signal CTL1 so that the switch closes when the switch control signal CTL1 is H and opens when the switch control signal CTL1 is L. Similarly, the switch 37 is ON/OFF controlled using a switch control signal CTL2 so that the switch closes when the switch control signal CTL2 is H and opens when the switch control signal CTL2 is L.

The calibration end instruction signal φS and the clock signal φC are input to the switch control circuit 38, and the switch control circuit 38 generates the switch control signals CTL1 and CTL2.

Figure 7:
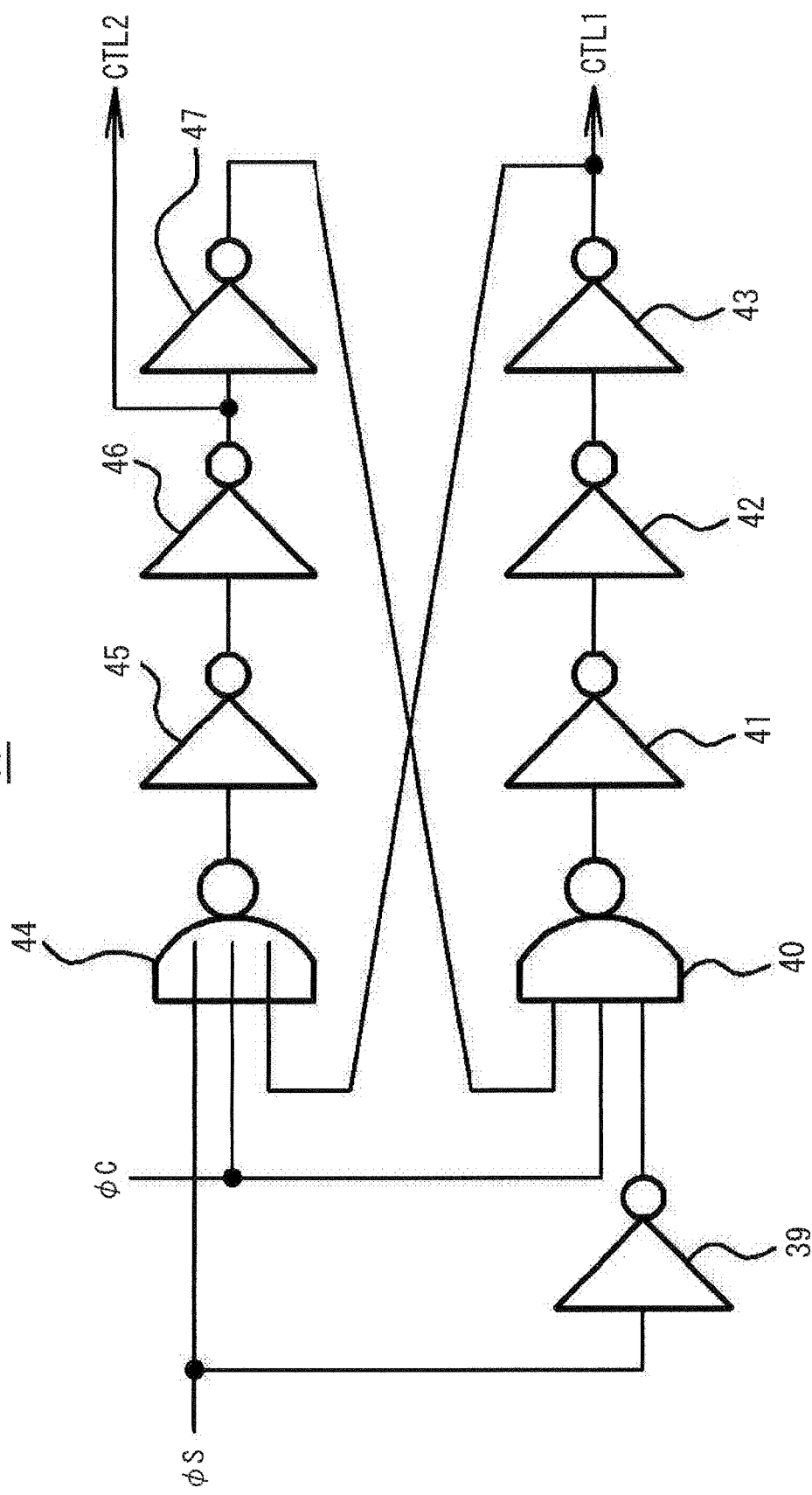
FIG. 7 illustrates an example of a switch control circuit according to the first embodiment in FIG. 1.

FIG. 7 is a circuit diagram showing a configuration example of the switch control circuit 38 in FIG. 6. The switch control circuit 38 has inverters 39, 41 to 43 and 45 to 47, a NAND circuit 40, and a NOR circuit 44.

The inverters 41, 42 and 43 are coupled in series in this order, and the inverters 45, 46 and 47 are also coupled in series in this order. The calibration end instruction signal φS is input to the NAND circuit 40 via the inverter 39, and the clock signal φC and the output of the inverter 47 are also input to the NAND circuit 40. The output of the NAND circuit 40 is input to the inverter 41. The calibration end instruction signal φS, the clock signal φC and the output of the inverter 43 are input to the NOR circuit 44. The output of the NOR circuit 44 is input to the inverter 45. The output of the inverter 43 is output as the switch control signal CTL1, and the output of the inverter 46 is output as the switch control signal CTL2.

FIG. 8 is a timing chart showing the operation of the switch control circuit 38 in FIG. 7. According to FIG. 8, φC represents the clock signal, φS represents the calibration end instruction signal, VLO represents the level at the negative feedback nodes (the outputs of the inverters 33 and 34), and the CTL1 and CTL2 represent the switch control signals.

As shown in FIG. 8, in the case that the calibration end instruction signal φS is L, the judgment result (the outputs of the inverters 33 and 34) of the latch LA in FIG. 3A is returned as negative feedback, and charging or discharging is performed accordingly. When the voltage exceeds a convergence point at which the offset is canceled, that is, when the result (the level at the negative feedback node VLO) of the judgment using the latch LA in FIG. 3A is switched, the calibration end instruction signal φS is asserted, and calibration is ended. In this way, a bias is set at the boundary point between 1 and 0.

Figure 9A:
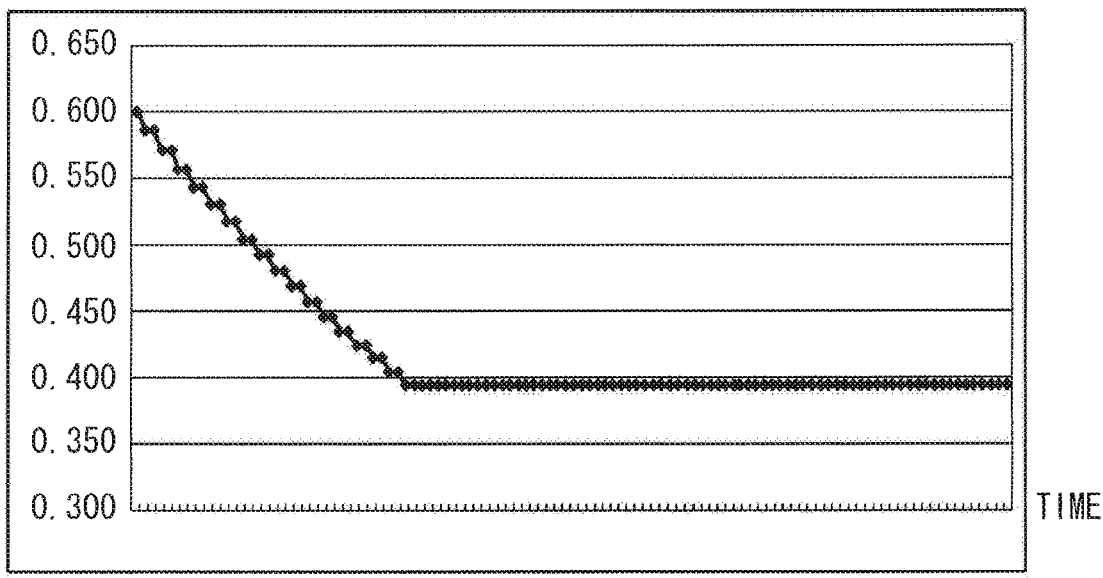
FIG. 9A illustrates convergence in the case that the calibration circuit in FIG. 5 is used.
Figure 9B:
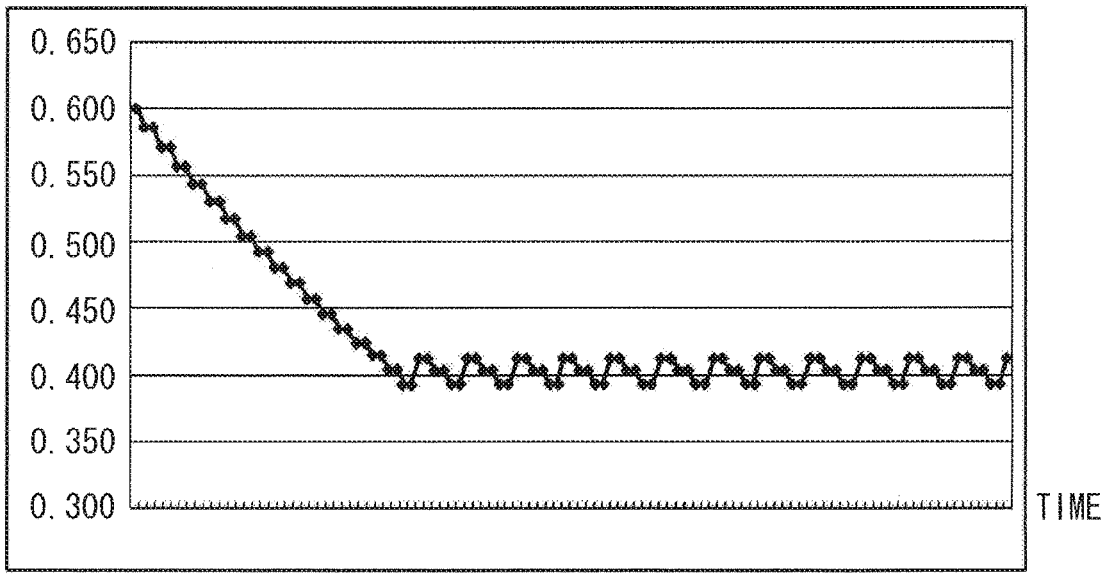
FIG. 9B illustrates an example of convergence in the case that calibration is performed in a constant period.

In the case that the state is shifted every specific period and calibration is performed in a constant period, calibration is performed such that the voltage oscillates on both the plus and minus sides of the convergence point (for example, the threshold value of the latch LA in FIG. 3A) as illustrated in FIG. 9B. Hence, calibration is completed at any point of the oscillation depending on the ending timing, whereby a plus-side or minus-side error from the convergence point is included randomly.

On the other hand, in the first embodiment, the end of calibration is judged, and the calibration is completed immediately after the calibration has converged (the voltage approached and has exceeded the convergent point).

As a result, as shown in FIG. 9A, the plus-side or minus-side error from the convergence point (for example, the threshold value of the latch LA) is included. Hence, the accuracy of calibration is improved, that is, becomes, for example, twice more than that in the case that calibration is performed in a constant period.

It may be possible that calibration operation accuracy (the calibration width for one operation) may be varied and multiple accuracies may be set to improve calibration accuracy and to shorten time. For example, it may be possible that the so-called coarse adjustment calibration in which the speed of calibration operation is relatively high although the accuracy of calibration is relatively not so high and the so-called fine adjustment calibration in which the accuracy of calibration is relatively high although the speed of calibration operation is relatively not so high are switched so as to be performed selectively.

Figure 10:
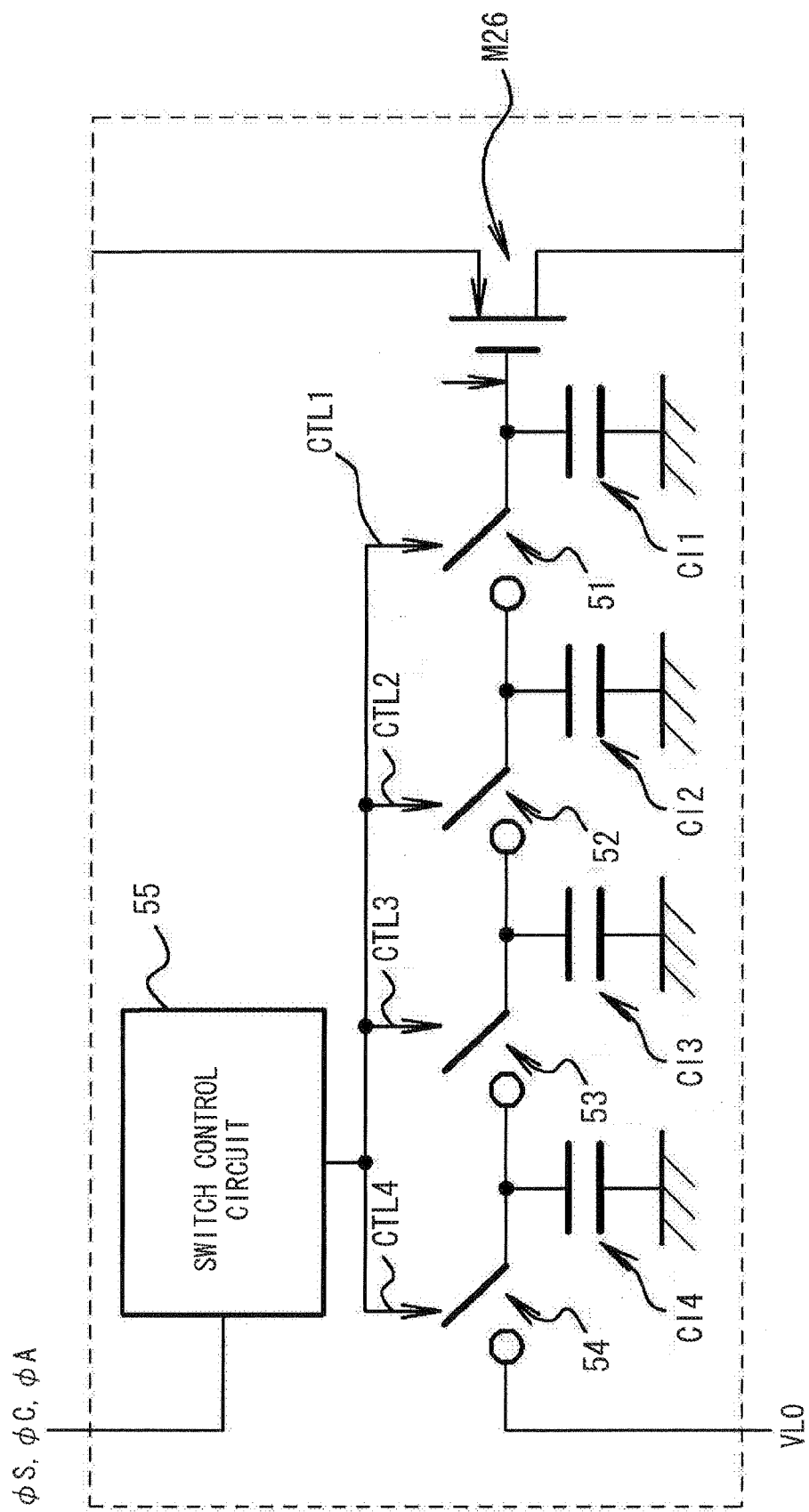
FIG. 10 illustrates another example of the calibration circuit according to the first embodiment in FIG. 1.

FIG. 10 is a circuit diagram showing another configuration example of the calibration circuits 31 and 32 in FIG. 5. The calibration circuit in FIG. 10 may be configured so that coarse adjustment calibration and fine adjustment calibration may be switched. Highly accurate calibration is performed in a short time by sequentially performing coarse adjustment calibration and fine adjustment calibration.

The calibration circuit in FIG. 10 has a PMOS transistor M26 for calibration, switches 51 to 54, capacitors CI1 to CI4, and a switch control circuit 55.

The drain of the PMOS transistor M26 outputs a calibration current. The source of the PMOS transistor M26 is coupled to the source (the power source voltage (VDD)) of the PMOS transistor M21 or M22 corresponding thereto, and the drain thereof is coupled to the drain of the PMOS transistor M21 or M22 corresponding thereto.

The switches 51 to 54 are coupled in series between the negative feedback node VLO and the gate of the PMOS transistor M26 so that one node of each switch is on the side of the negative feedback node VLO and the other node thereof is on the gate side of the PMOS transistor M26. Each of the capacitors CI1 to CI4 is coupled between the other node of each of the switches 51 to 54 and the ground. The capacitance value of the capacitor CI1 may be larger than those of the other capacitors CI2 to CI4. The negative feedback node VLO is coupled to the output terminal of the inverter 34 or 33 corresponding thereto.

The switch 51 is ON/OFF controlled using a switch control signal CTL1 and the switch 52 is ON/OFF controlled using a switch control signal CTL2. Similarly, the switch 53 is ON/OFF controlled using a switch control signal CTL3 and the switch 54 is ON/OFF controlled using a switch control signal CTL4. Each of the switches 51 to 54 closes in the case that each of the switch control signals CTL1 to CTL4 corresponding thereto is H and opens in the case that each of the switch control signals CTL1 to CTL4 corresponding thereto is L.

The calibration end instruction signal φS, the clock signal φC and a coarse/fine adjustment control signal φA are input to the switch control circuit 55, and the switch control circuit 55 generates the switch control signals CTL1 to CTL4.

FIG. 11 is a timing chart showing the operation of the switch control circuit 55 in FIG. 10. According to FIG. 11, φC represents the clock signal, φA represents the coarse/fine adjustment control signal, VLO represents the level at the negative feedback nodes (the outputs of the inverters 33 and 34), and the CTL1 to CTL4 represent the switch control signals.

In the switch control circuit 55 of FIG. 10, in the period during which the calibration end instruction signal φS is H, all switch control signals CTL1 to CTL4 are set to L.

In the case that the calibration end instruction signal φS is L and that the coarse/fine adjustment control signal φA is L, the switch control signals CTL2 and CTL3 become H. In this case, the switch control signal CTL1 becomes H and the switch control signal CTL4 becomes L when the clock signal φC rises, and the switch control signal CTL1 becomes L and the switch control signal CTL4 becomes H when the clock signal φC falls. Hence, the capacitors CI2, CI3 and CI4 are coupled in parallel, and coarse adjustment calibration is attained.

In the case that the calibration end instruction signal φS is H and that the coarse/fine adjustment control signal φA is H, the switch control signals CTL1 and CTL3 become H and the switch control signals CTL2 and CTL4 become L when the clock signal φC rises. The switch control signals CTL1 and CTL3 become L and the switch control signals CTL2 and CTL4 become H when the clock signal φC falls. Hence, fine adjustment calibration is attained.

In the case of the configuration of the calibration circuit in FIG. 10, it may be possible that control is performed so that the coarse/fine adjustment control signal φA is changed from L to H when the first judgment result of the latch LA during calibration operation is switched. Furthermore, control may be performed so that the calibration end instruction signal φS is changed from L to H when the judgment result of the latch LA is switched while the coarse/fine adjustment control signal φA is H.

In the case that the calibration circuit is configured as shown in FIG. 10, if calibration is performed in a temporarily constant period, latency becomes longer by one clock cycle.

Figure 12A:
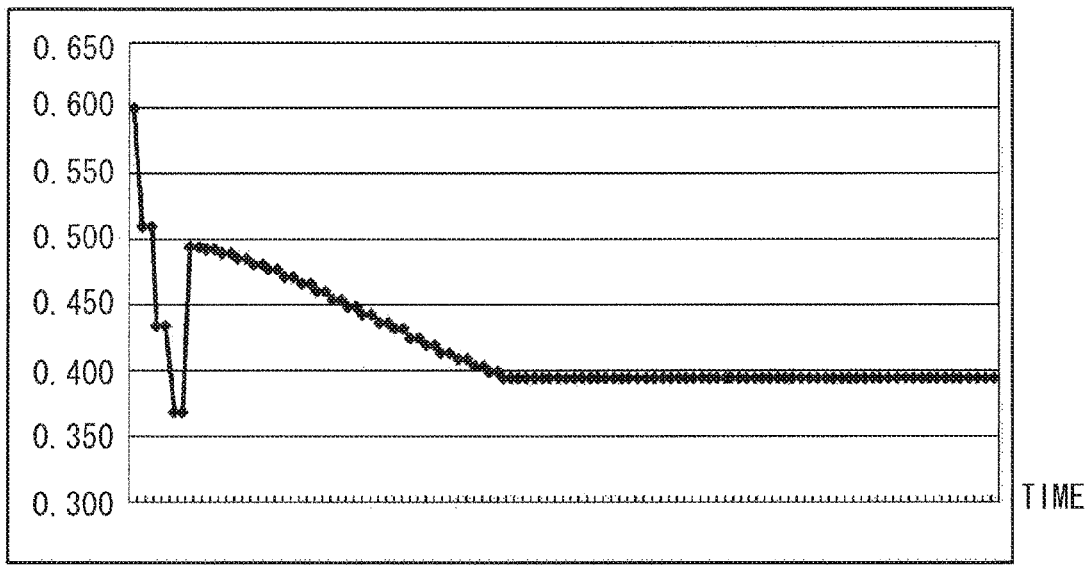
FIG. 12A illustrates convergence in the case that the calibration circuit in FIG. 10 is used.
Figure 12B:
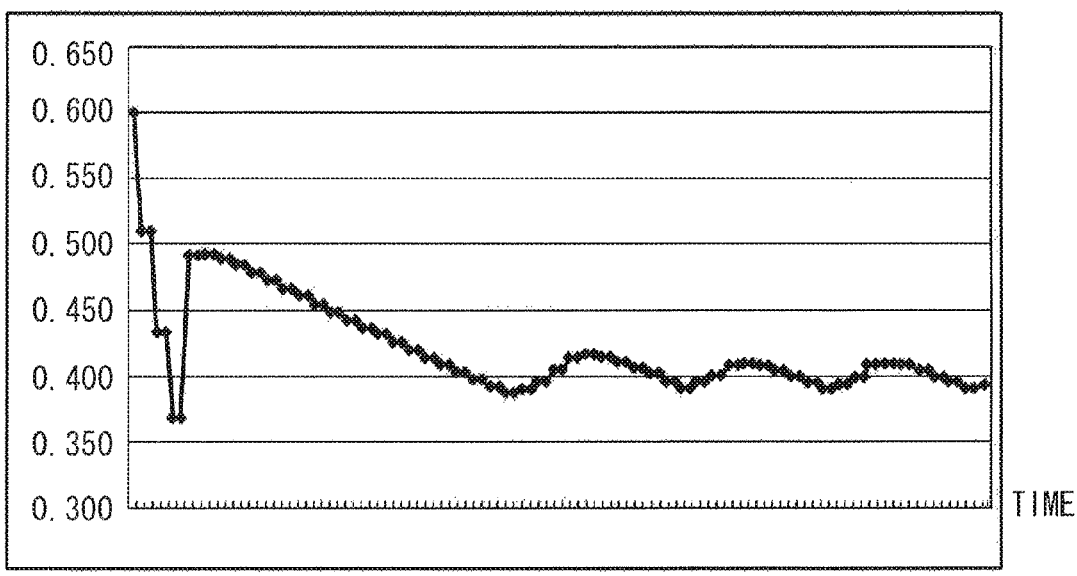
FIG. 12B illustrates an example of convergence in the case that calibration is performed in a constant period.

As shown in FIG. 12B, oscillation tends to occur even if the calibration width for one operation is decreased. Hence, the actual accuracy of calibration is not determined by the calibration width for one operation.

In the first embodiment, calibration is completed immediately after the calibration has converged (the voltage approached and has exceeded the convergence point). As a result, as shown in FIG. 12A, highly accurate calibration is performed depending on the calibration width for one operation.

Figure 13:
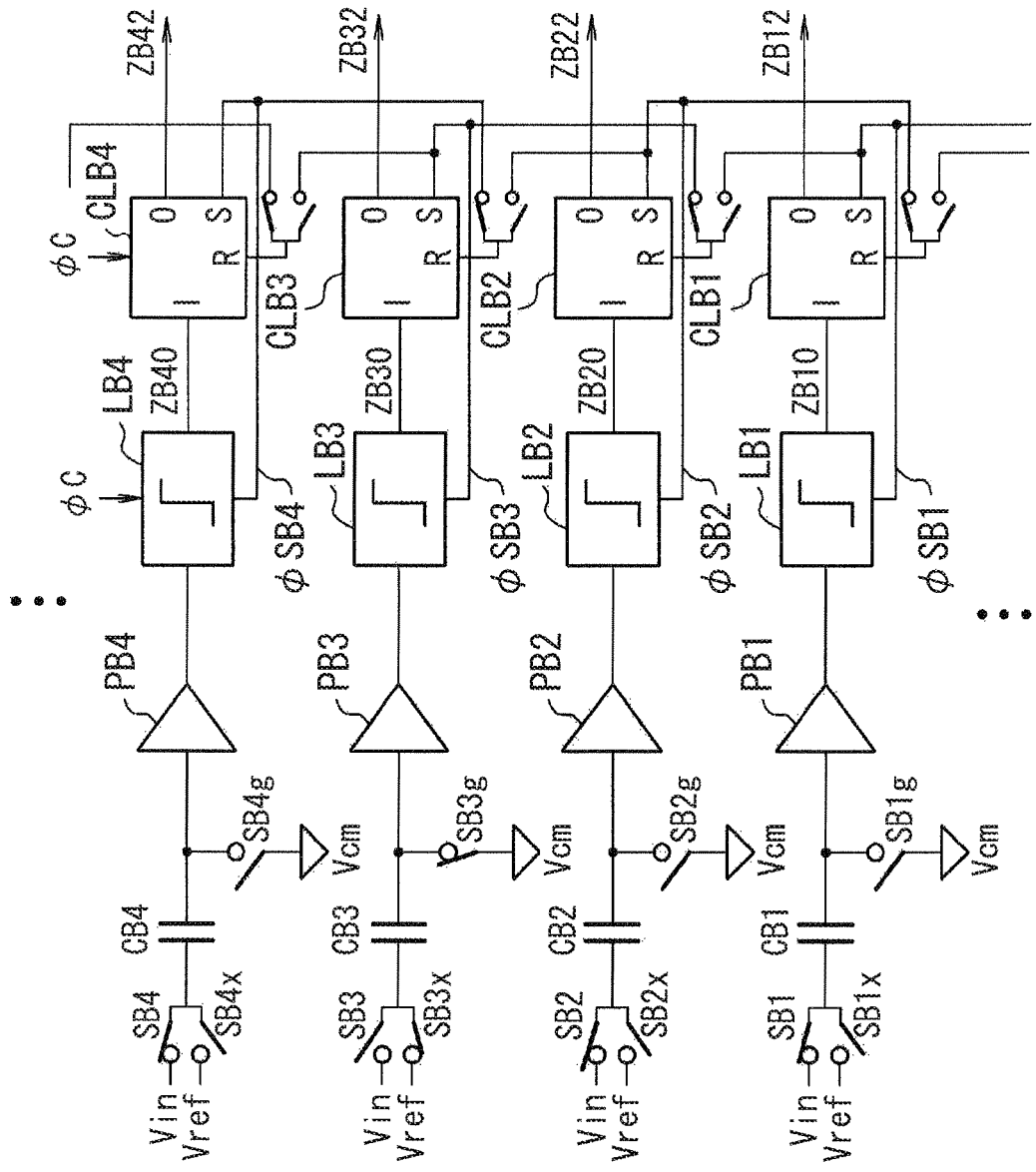
FIG. 13 illustrates an example of a parallel A/D converter according to the first embodiment in FIG. 1.

FIG. 13 is a circuit diagram showing a configuration example of the parallel A/D converter to which the semiconductor device of FIG. 1 is applied, according to the first embodiment. FIG. 13 illustrates part of the parallel A/D converter.

In FIG. 13, switches SBk and SBkx (k=1 to 4 in FIG. 13) are switches that perform switching so that the analog input signal Vin or the reference voltage Vref is supplied to a capacitor CBk coupled to a preamplifier PBk. To the capacitor CBk, the reference voltage Vref is supplied via the switch SBkx during calibration, and the analog input signal Vin is supplied via the switch SBk during normal operation.

The preamplifier PBk amplifies the input signal and outputs an amplified signal. The input terminal of the preamplifier PBk is coupled to the capacitor CBk. In addition, the common-mode potential Vcm may be supplied via a switch SBkg to the input terminal.

A latch LBk judges the digital logic level (1 or 0) of the analog input signal Vin. The latch LBk performs a magnitude comparison between the reference voltage Vref and the analog input signal Vin based on the output of the preamplifier PBk coupled thereto to judge the digital logic level. The clock signal φC and a calibration end instruction signal φSBk are supplied as control signals to the latch LBk. The calibration end instruction signal φSBk is a signal instructing the end of the calibration being performed.

A calibration control circuit CLBk is a circuit for judging the end of calibration and operates based on the clock signal φC supplied thereto. To the first input terminal I of the calibration control circuit CLBk, the output ZBk0 of the latch LBk is input. The calibration control circuit CLBk outputs an output ZBk2 from the first output terminal O thereof and outputs the calibration end instruction signal φSBk from the second output terminal S thereof.

The calibration end instruction signal φSB (k+1) output from the calibration control circuit CLB (k+1) or the calibration end instruction signal φSB (k−1) output from the calibration control circuit CLB (k−1) is input to the second input terminal R of the calibration control circuit CLBk. More specifically, in the case that calibration is performed sequentially in the direction of the arrangement of the preamplifiers, . . . , PB1, PB2, PB3, PB4, . . . , the calibration end instruction signal φSB(k−1) output from the calibration control circuit CLB(k−1) is input to the second input terminal R of the calibration control circuit CLBk. On the other hand, in the case that calibration is performed sequentially in the direction of the arrangement of the preamplifiers, . . . , PB4, PB3, PB2, PB1, . . . , the calibration end instruction signal φSB(k+1) output from the calibration control circuit CLB(k+1) is input to the second input terminal R of the calibration control circuit CLBk.

Figure 14:
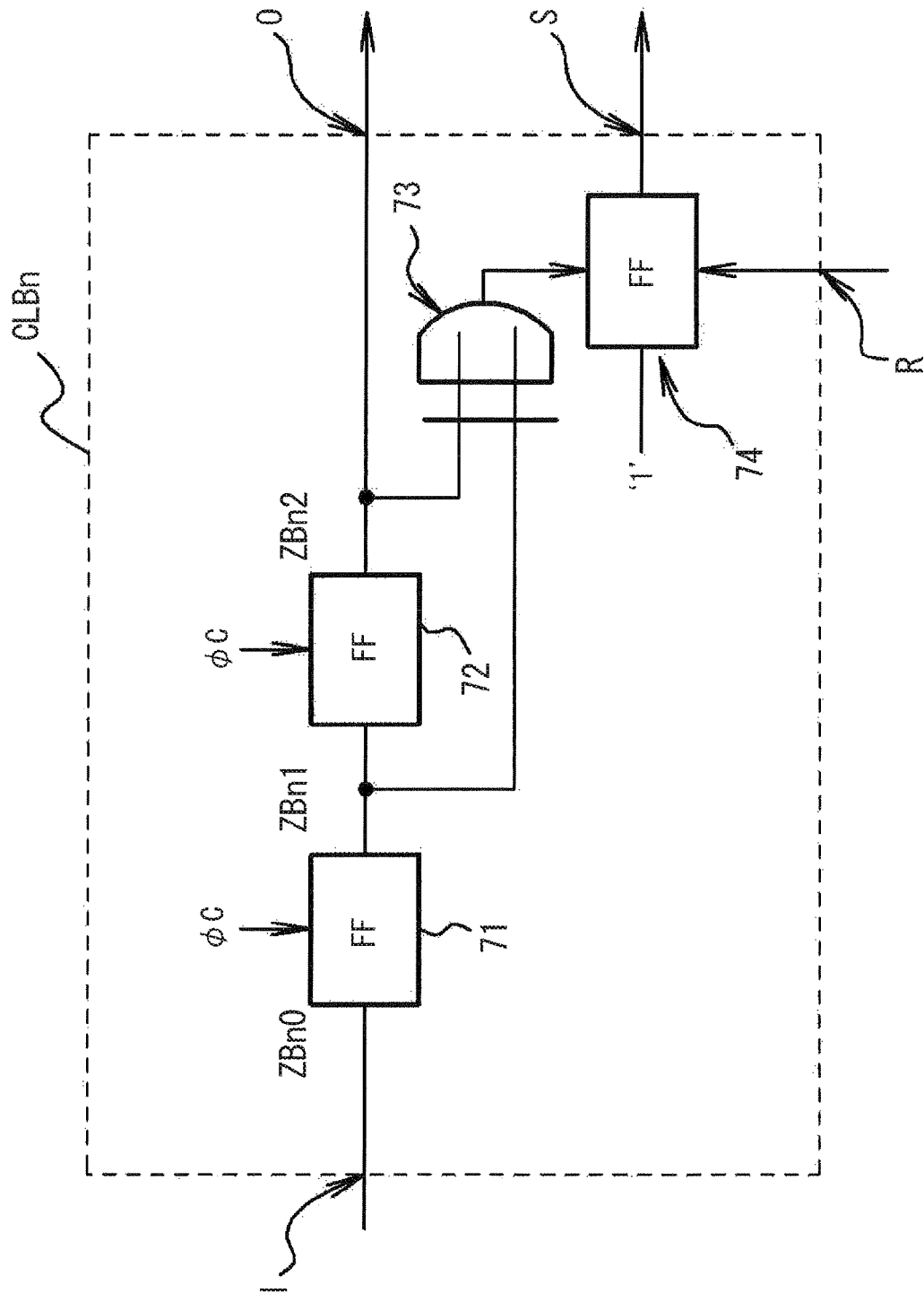
FIG. 14 illustrates the calibration control circuit in FIG. 13.

FIG. 14 is a circuit diagram showing a configuration example of the calibration control circuits in FIG. 13. The respective calibration control circuits are configured similarly, and FIG. 14 shows an nth calibration control circuit CLBn as an example. The calibration control circuit CLBn has, for example, flip-flops 71, 72 and 74, and an EXOR circuit 73.

The output ZBn0 of the latch LBn input to the first output terminal I of the calibration control circuit CLBn is input the flip-flop 71, and the output ZBn1 of the flip-flop 71 is input to the flip-flop 72. The output ZBn2 of the flip-flop 72 is output from the first output terminal O of the calibration control circuit CLBn. The clock signal φC is supplied to the flip-flops 71 and 72, and the flip-flops operate based on the clock signal.

The outputs ZBn1 and ZBn2 of the flip-flops 71 and 72 are input to the EXOR circuit 73. A signal having a logic level 1 (H) is input to the flip-flop 74, and the flip-flop 74 operates by using the output of the EXOR circuit 73 as a clock signal. The output of the flip-flop 74 is output as a calibration end instruction signal φSBn from the second output terminal S of the calibration control circuit CLBn. The calibration end instruction signal φSB(n+1) or φSB(n−1) is input to the flip-flop 74 from the second input terminal R of the calibration control circuit CLBn, and the output of the flip-flop is reset based on the signal.

The operation of the parallel A/D converter in FIG. 13 will be described below. In the state depicted in FIG. 13, the preamplifier PB3 and the latch LB3 are performing calibration and the preamplifiers and the latches other than the preamplifier PB3 and the latch LB3 are performing normal operations. In the following description, it is assumed that calibration is performed in the direction of the arrangement of the preamplifiers: PB4, PB3, PB2, PB1.

During the normal operation (during A/D conversion), the corresponding calibration end instruction signal φSB is H (asserted). When the calibration being performed at the preamplifier PB4 and the latch LB4 is ended, the calibration end instruction signal φSB4 having been L (negated) is changed to H. As a result, the calibration end instruction signal φSB3 output from the calibration control circuit CLB3 is reset to L, and calibration is started at the preamplifier PB3 and the latch LB3.

During the calibration, the switch SB3g is turned ON using a control signal φm3 obtained by inverting the calibration end instruction signal φSB3, and the preamplifier PB3 is biased with the common mode potential Vcm. The switch SB3 is turned OFF and the switch SB3x is turned ON, whereby the reference voltage Vref is supplied to the capacitor CB3 via the switch SB3x.

The preamplifier PB3 amplifies the common mode potential Vcm and transmits an amplified output to the latch LB3. The latch LB3 performs calibration based on the output of the preamplifier PB3. If the voltage exceeds the convergence point at which the offset is canceled during calibration, the judgment result of the latch LB3 is switched, and the output ZB30 of the latch LB3 is inverted. This switching point of the judgment of the latch LB3 is detected using the calibration control circuit CLB3, and the calibration end instruction signal φSB3 becomes H. More specifically, the calibration control circuit CLB3 detects the switching point of the judgment of the latch LB3 by operating the outputs ZBn1 and ZBn2 of the flip-flops 71 and 72 using the EXOR circuit 73 provided inside the control circuit.

Figure 15:
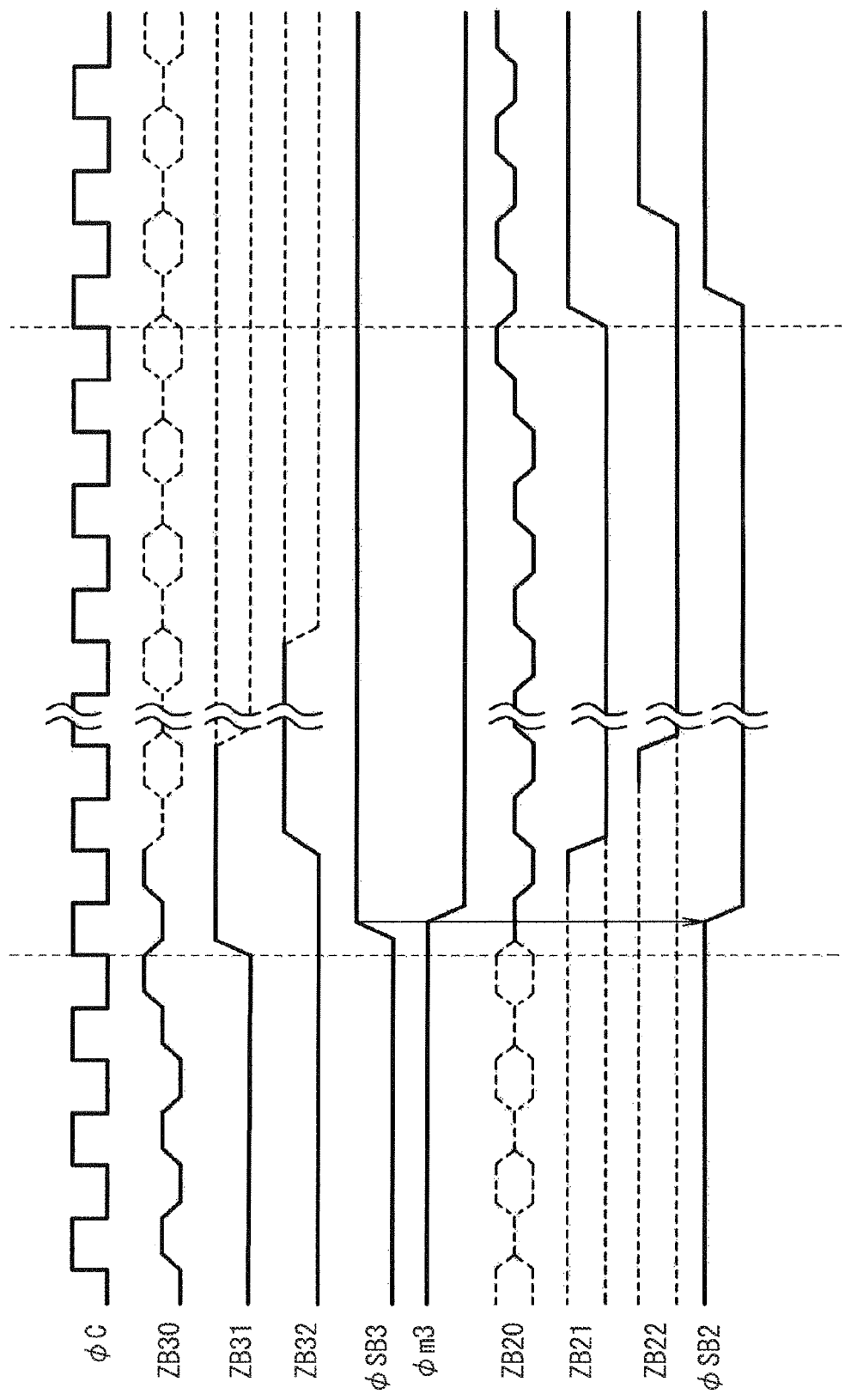
FIG. 15 illustrates a timing chart showing the operation of the parallel A/D converter in FIG. 13.

When the calibration end instruction signal φSB3 becomes H, the calibration performed at the preamplifier PB3 and the latch LB3 is ended, and the state is shifted to the next state, and calibration is started at the next preamplifier and latch. In this example, when the calibration end instruction signal φSB3 becomes H, the calibration end instruction signal φSB2 output from the calibration control circuit CLB2 is reset to L, and calibration is started at the preamplifier PB2 and the latch LB2. The timing chart indicating the above-mentioned operation is illustrated in FIG. 15.

In a similar manner, when the switching point of the judgment of the latch LBk is detected using the calibration control circuit CLBk, the calibration end instruction signal φSBk becomes H, and the calibration at the preamplifier PBk and the latch LBk is ended. Furthermore, the state is shifted to the next state, and calibration is started at the next preamplifier and latch. This operation is performed sequentially, and calibration is performed in the background.

During calibration, the node between the capacitor CBk and the preamplifier PBk is biased with the common mode potential Vcm, and the reference voltage Vref is applied to the terminal of the capacitors CBk on the opposite side of the preamplifier PBk. As a result, calibration is performed using the reference voltage Vref, and the reference voltage Vref serves as the switching point (threshold value) of the judgment.

When the calibration is ended, the switch SBkg for coupling to the common-mode potential Vcm is first turned OFF. Then, the switches SBk and SBkx are controlled so that the analog input signal Vin is supplied instead of the reference voltage Vref, and normal operation (A/D conversion) is performed. During normal operation, the difference voltage between the reference voltage Vref and the analog input signal Vin is applied to the preamplifier PBk. Since calibration is performed using the reference voltage Vref at the latch LBk, the judgment is performed based on the reference voltage.

Figure 16:
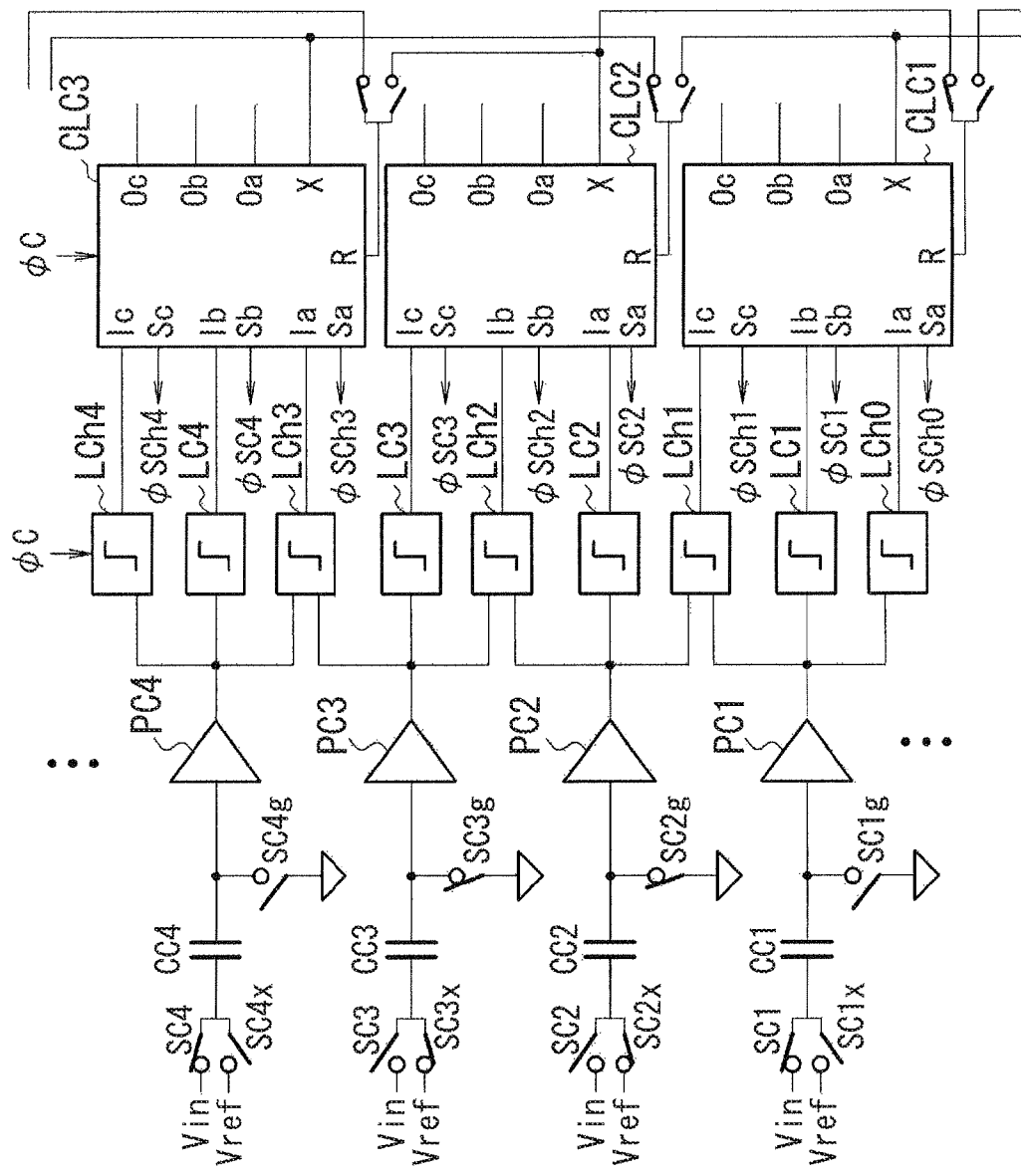
FIG. 16 illustrates another example of the parallel A/D converter according to the first embodiment in FIG. 1.

FIG. 16 is a circuit diagram showing another configuration example of the parallel A/D converter to which the semiconductor device in FIG. 1 according to the first embodiment may be applied. FIG. 16 illustrates an example to which a parallel A/D converter having interpolation comparators is applied and shows part of the parallel A/D converter.

In FIG. 16, switches SC1 to SC4 and SC1x to SC4x are switches that perform switching so that the analog input signal Vin or the reference voltage Vref is supplied to capacitors CC1 to CC4 coupled to preamplifiers PC1 to PC4. To the capacitors CC1 to CC4, the reference voltage Vref is supplied via the switches SC1x to SC4x during calibration, and the analog input signal Vin is supplied via the switches SC1 to SC4 during normal operation.

Each of the preamplifiers PC1 to PC4 amplifies the input signal and outputs an amplified signal. The input terminals of the preamplifiers PC1 to PC4 are coupled to the capacitors CC1 to CC4, respectively. In addition, the common-mode potential Vcm may be supplied via switches SC1g to SC4g to the input terminals.

Latches LC1 to LC4 and LCh0 to LCh4 judge the digital logic level (1 or 0) of the analog input signal Vin. The latches LC1 to LC4 directly coupled to the preamplifiers PC1 to PC4 perform a magnitude comparison between the reference voltage Vref and the analog input signal Vin based on the outputs of the preamplifiers coupled thereto to judge the digital logic level. Each of the interpolation latches LCh0 to LCh4 to which the outputs of two preamplifiers are coupled judges the digital logic level based on the average of the outputs of the preamplifiers coupled thereto.

The clock signal φC and calibration end instruction signals φSC1 to φSC4 are supplied as control signals to the latches LC1 to LC4. The clock signal φC and calibration end instruction signals φSCh0 to φSCh4 are supplied as control signals to the latches LCh0 to LCh4. The calibration end instruction signals φSC1 to φSC4 and φSCh0 to φSCh4 are signals instructing the end of the calibration being performed.

Calibration control circuit CLC1 to CLC3 are circuits for judging the end of calibration at the respective comparators and operate based on the clock signal φC supplied thereto. To the first input terminals Ia to Ic of the calibration control circuits CLC1 to CLC3, the outputs of the latches corresponding thereto are input and then output from the first output terminals Oa to Oc of the control circuits. Each of the calibration control circuits CLC1 to CLC3 outputs a calibration end instruction signal to the latch of the comparator corresponding thereto from the second output terminals Sa to Sc and also outputs a reset signal from a third output terminal X.

The reset signal output from the calibration control circuit CLC(i+1) or the reset signal output from the calibration control circuit CLC(i−1) is input to the second input terminal R of the calibration control circuit CLCi (i is an integer) via a switch.

Figure 17:
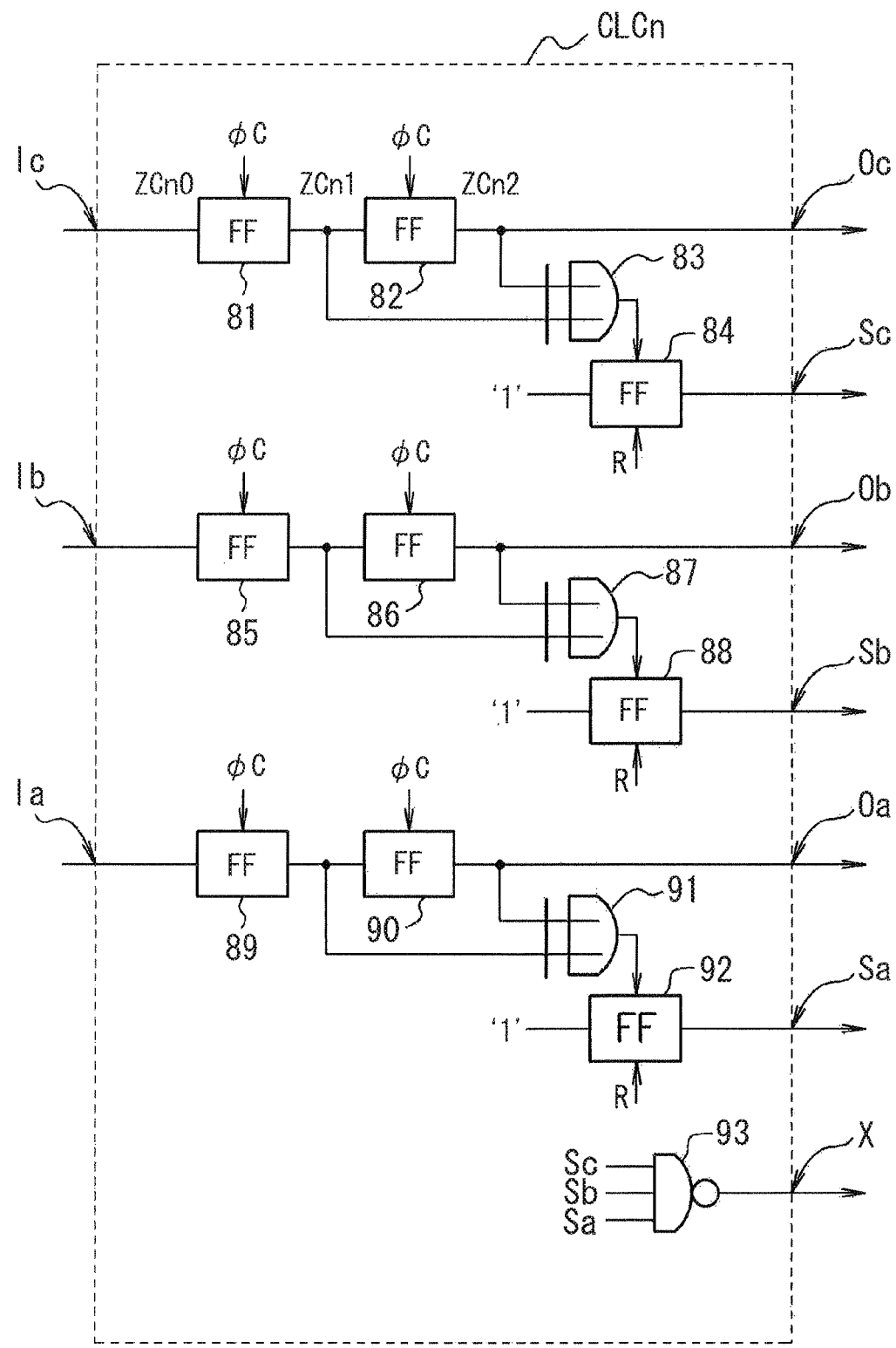
FIG. 17 illustrates a timing chart showing the operation of the calibration control circuit in FIG. 16.

FIG. 17 is a circuit diagram showing a configuration example of the calibration control circuits depicted in FIG. 16. The respective calibration control circuits are configured similarly, and FIG. 17 illustrates an nth calibration control circuit CLCn as an example. The calibration control circuit CLCn has, for example, flip-flops 81, 82, 84 to 86, 88 to 90 and 92, EXOR circuits 83, 87 and 91, and a NAND circuit 93.

As in the case of the calibration control circuit in FIG. 14, the circuit for detecting the switching of the judgment result of the latch coupled to the input terminal Ic has the flip-flops 81, 82 and 84 and the EXOR circuit 83. The circuit for detecting the switching of the judgment result of the latch coupled to the input terminal Ib has the flip-flops 85, 86 and 88 and the EXOR circuit 87. The circuit for detecting the switching of the judgment result of the latch coupled to the input terminal Ia has the flip-flops 89, 90 and 92 and the EXOR circuit 91.

To the NAND circuit 93, the outputs (the calibration end instruction signals of the comparators coupled to the input terminals Ia to Ic) of the flip-flops 84, 88 and 92 are input, and the output of the NAND circuit 93 is output as a reset signal.

The operation of the parallel A/D converter in FIG. 16 will be described below. Since the calibration operation and the normal operation at each comparator (preamplifier and latch) of the parallel A/D converter in FIG. 16 are similar to those at each comparator of the parallel A/D converter in FIG. 13, their detailed descriptions are omitted.

In the state depicted in FIG. 16, the reference voltage Vref is supplied to the preamplifiers PC2 and PC3, which are performing calibration. When the calibration is started, the calibration end instruction signals φSC2, φSCh2 and φSC3 output from the output terminals Sa to Sc are set to L by the reset signal input from a calibration control circuit (CLC1 or CLC3) other than the calibration control circuit CLC2.

The switches SC2g and SC3g are turned ON using the control signals φm2 and φm3 obtained based on the reset signal supplied from the calibration control circuit CLC1 or CLC3. The switches SC2 and SC3 are turned OFF, and the switches SC2x and SC3x are turned ON. Hence, the preamplifiers PC2 and PC3 are biased with the common-mode potential Vcm, and their outputs are transmitted to the corresponding latches disposed at the subsequent stage. The latches perform calibration based on the outputs of the preamplifiers PC2 and PC3. The calibration control circuit CLC2 detects the switching point of the judgment of each of the latches coupled to the preamplifiers and sets the calibration end instruction signal φSC2, φSCh2 or φSC3 corresponding to each of the latches in which the switching point of the judgment result is detected to H. Hence, the calibration operation of the latch of each comparator is ended independently.

When the calibration control circuit CLC2 detects that the calibration at each latch coupled thereto has been ended and that the calibration at all the latches (LC2, LCh2 and LC3) has been completed, the calibration control circuit sets the reset signal to L and shifts the state to the next state. In other words, when the reset signal from the calibration control circuit CLC2 transitions from H to L, the calibration end instruction signal output from the calibration control circuit coupled to the comparator at which calibration may be performed next is reset to L, and the next calibration is started.

Figure 18:
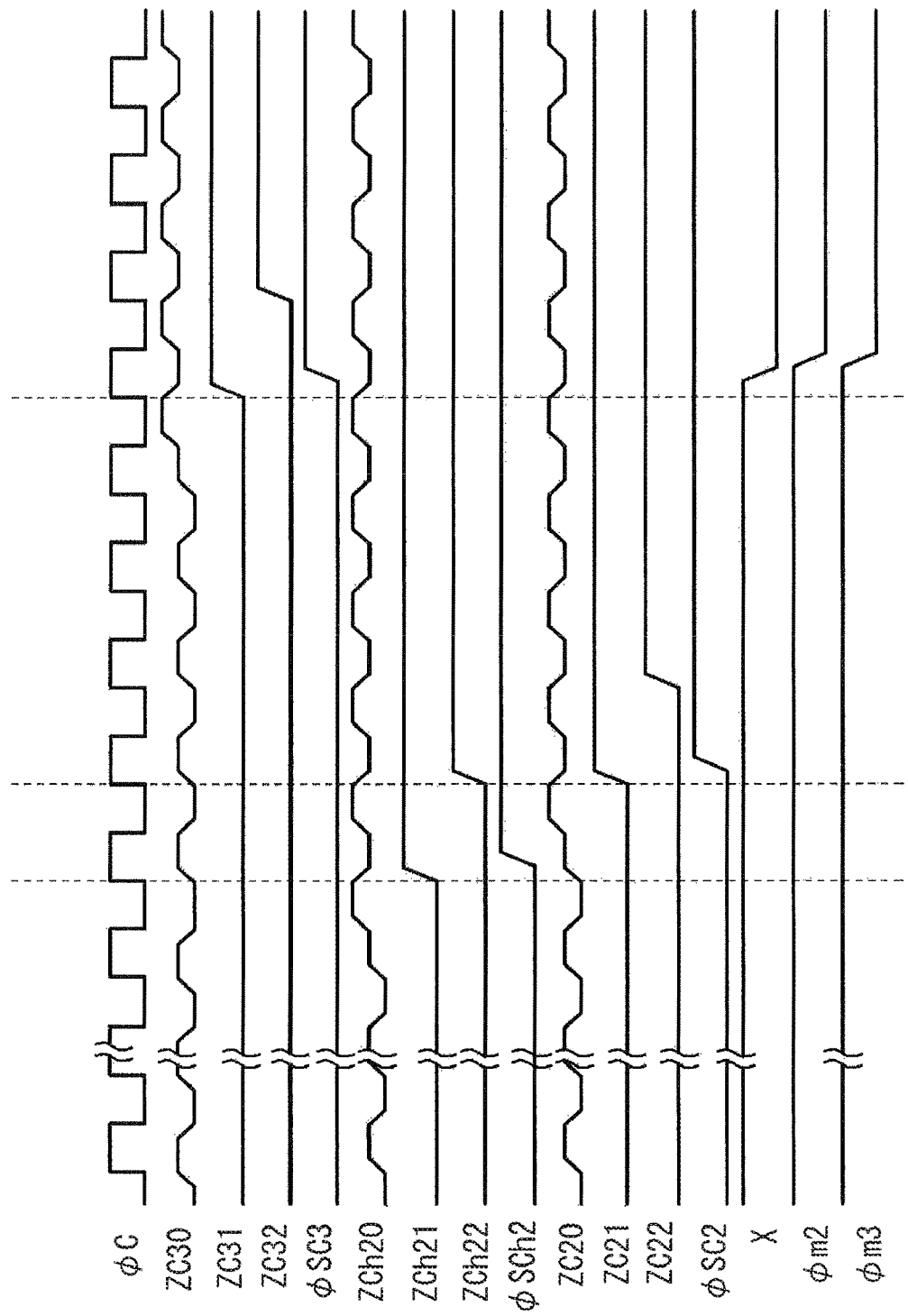
FIG. 18 illustrates a timing chart showing the operation of the parallel A/D converter in FIG. 16.

The timing chart indicating the above-mentioned operation is illustrated in FIG. 18. According to FIG. 18, ZC30, ZCh20 and ZC20 are outputs of the latches LC3, LCh2 and LC2. ZC31, Zch21 and ZC21 are the outputs of the flip-flops to which ZC30, ZCh20 and ZC20 are input, and ZC32, Zch22 and ZC22 are the outputs of the flip-flops to which ZC31, ZCh21 and ZC21 are input. X is a reset signal based on the calibration end instruction signals φSC2, φSCh2 and φSC3.

Given a sampling frequency fs, if the sampling timing has an error of a constant value every n cycles, its spurs occur at a frequency equivalent to that obtained when sampling is performed at a sampling clock having a frequency of fs/n. If the constant number of cycles n is changed to any value, for example, between k and 1, the frequency of the spurs are distributed between fs/1 to fs/k. Hence, although the total amount of the spurs are unchanged, the peak value thereof is reduced by the distribution.

According to the first embodiment, the end of calibration is judged, the state is shifted to the next state immediately after the end of calibration, and the next calibration is performed. Calibration may be performed by performing switching at an unspecified random period instead of every predetermined specific period. As a result, the spurs generated at a specific frequency are distributed to a wider frequency range, and the characteristics are improved. Consequently, the characteristics may be improved by using the semiconductor device according to this embodiment in the case that the semiconductor device is used, for example, in the communications field in which spurious free dynamic range (SFDR) is considered important or in the case that spurs generated by the switching of background calibration limits performance.

In the case that background calibration is performed by switching every predetermined constant period, since calibration may be related to convergence within the constant period, the number of cycles is set to more than that related for the actual convergence. As a result, the interval between the execution of calibration and the execution of the next calibration becomes longer in proportion to the clock period, and the operation at low speed is limited due to the effect of leakage or the like caused by the long interval. According to the first embodiment, the end of calibration is judged, and the state is shifted to the next state immediately after the end of calibration. For example, the state is shifted in the minimum calibration period, whereby the interval between calibration operations is shortened. As a result, the effect due to charge leakage or the like is reduced, and the limitation of the low-speed operation is relieved.

For example, in the case that this embodiment is applied to a parallel A/D converter in which background calibration is performed while the state is shifted as shown in FIG. 2, the calibration interval is generally different at each location in which a comparator is disposed. Furthermore, since an error occurs in proportion to the interval at the judgment point due to charge leakage or the like, the period to the end of calibration is different for each comparator. Hence, in the parallel A/D converter to which this embodiment is applied, the spurs generating frequency are distributed without any special setting, for example.

A second embodiment will be described below. In a semiconductor device according to the second embodiment described below, A/D converters are disposed so as to form a multi-channel arrangement. The A/D converters of some specific channels thereof perform background calibration, and the other A/D converters perform the actual A/D conversion operation.

FIG. 19A illustrates a configuration example of a semiconductor device according to the second embodiment, and FIG. 19B illustrates an example of operation timing according to the second embodiment.

In FIG. 19A, numeral 101 designates a first selection section, numerals 102A to 102C designate A/D converters, and numeral 103 designates a second selection section. The analog input signal Vin is input to the first selection section 101. The first selection section 101 outputs the analog input signal Vin input thereto to the A/D converters 102A to 102C not performing calibration, according to control signals not shown.

The A/D converters 102A to 102C convert the input analog signal into a digital signal (A/D conversion) and output the digital signal. In this embodiment, the A/D conversion method of the A/D converters 102A to 102C is not limited, but A/D converters based on any conversion methods may be applied to the A/D converters according to this embodiment. For example, pipeline A/D converters, successive approximation A/D converters, etc. may also be applied. Although an example in which A/D converters of three channels are disposed is illustrated in FIG. 19A, the number of the channels (the number of the A/D converters) may be changed as desired.

The second selection section 103 is coupled to the outputs of the A/D converters 102A to 102C and outputs the digital signal Dout obtained by A/D converting the analog input signal Vin. The second selection section 103 selects the output of an A/D converter actually performing A/D conversion from among the A/D converters 102A to 102C and outputs the output of the A/D converter as the digital signal Dout according to control signals not shown.

In the semiconductor device according to the second embodiment, background calibration is performed in units of A/D converters (in units of channels). As shown in FIG. 19B, in the case that the A/D converter 102A of the A-channel (Ach) is performing calibration (in period T13), the A/D converter 102B of the B-channel (Bch) and the A/D converter 102C of the C-channel (Cch) perform actual A/D conversion to convert the analog input signal Vin. Similarly, in the case that the A/D converter 102B of the B-channel is performing calibration (in periods T12 and T15), the A/D converter 102A of the A-channel and the A/D converter 102C of the C-channel convert the analog input signal Vin. In the case that the A/D converter 102C of the C-channel is performing calibration (in periods T11 and T14), the A/D converter 102A of the A-channel and the A/D converter 102B of the B-channel convert the analog input signal Vin.

In the second embodiment, calibration is performed for all channels while the switching period is changed, without performing switching every constant period, regardless of channels. The period of switching the A/D converters 102A to 102C performing calibration may be set so as to be different for each channel, that is, the A/D converter of the similar channel may always perform calibration at the similar number of cycles, or even the similar channel may be switched at different numbers of cycles each time calibration is performed.

For example, in the case that the setting is made different for each channel, it may be possible that a calibration period being different for each channel is preset and the A/D converters 102A to 102C perform calibration accordingly. For example, in the case that the similar channel is switched at different numbers of cycles, it may be possible that calibration is performed while the calibration period (a period not less than the minimum calibration period provided for the A/D converters 102A to 102C) is set randomly, for example, by generating a random number each time calibration is performed.

For example, it may be possible that the A/D converters 102A to 102C are provided with functions similar to those of the first embodiment, and each of the A/D converters 102A to 102C detects the completion of internal calibration and informs the result of the detection, whereby calibration is started at the next converter of the A/D converters 102A to 102C.

According to the second embodiment, calibration is performed at the A/D converters 102A to 102C while the switching period change sent, without performing switching every constant period for all channels, whereby the spur generating frequency is distributed, and the characteristics are improved.

Figure 20:
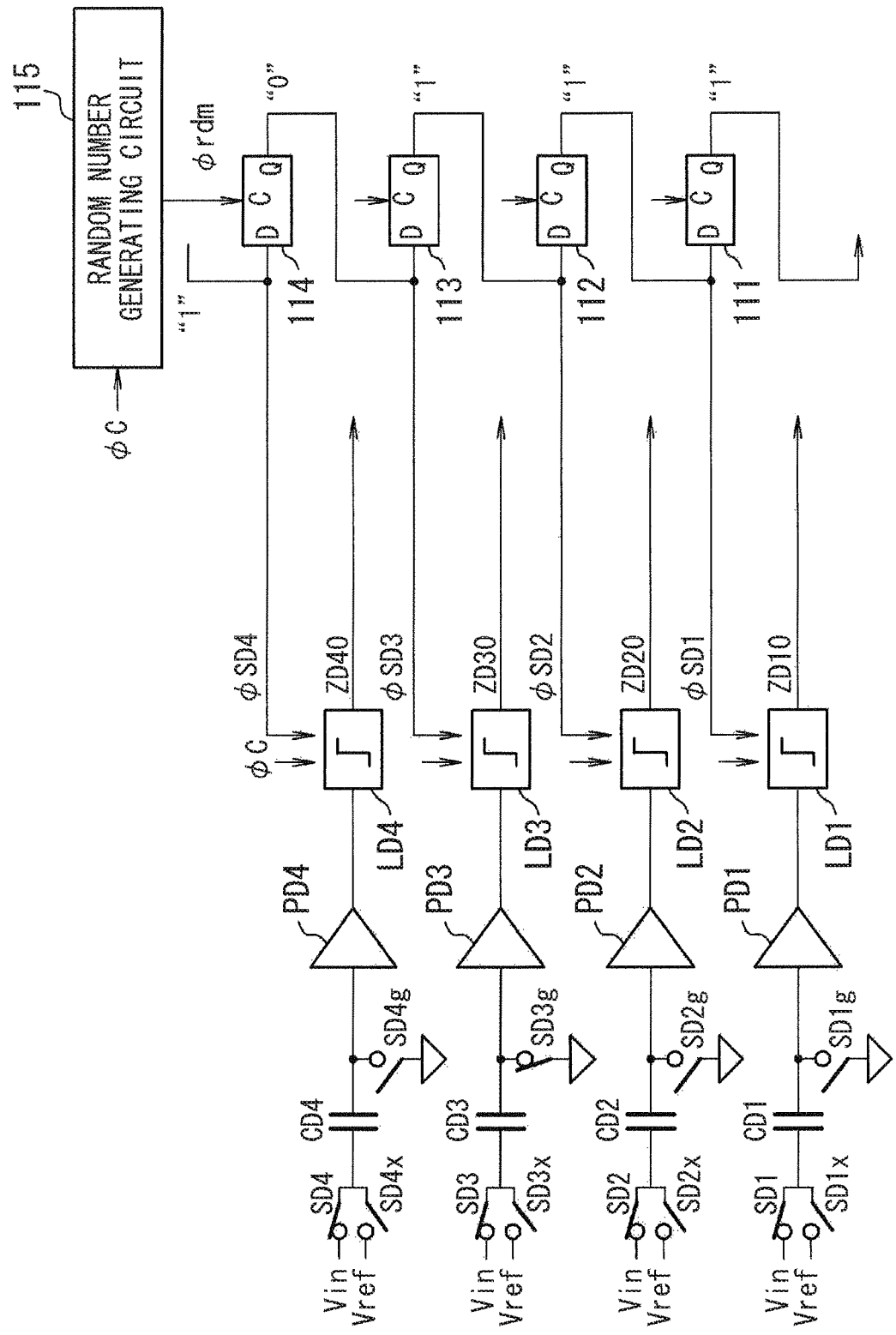
FIG. 20 illustrates a third embodiment.

A third embodiment will be described below. FIG. 20 is a circuit diagram showing a configuration example of a parallel A/D converter to which the semiconductor device according to the third embodiment is applied. A part of the parallel A/D converter is illustrated in FIG. 20.

In FIG. 20, switches SDk and SDkx (k=1 to 4 in FIG. 20) are switches that perform switching so that the analog input signal Vin or the reference voltage Vref is supplied to a capacitor CDk. The reference voltage Vref is supplied via the switch SDkx during calibration to the capacitor CDk, and the analog input signal Vin is supplied via the switch SDk during normal operation.

The preamplifier PDk amplifies the input signal and outputs an amplified signal. The input terminal of the preamplifier PDk is coupled to the capacitor CDk. In addition, the common-mode potential Vcm is supplied via a switch SDkg to the input terminal.

A latch LDk judges the digital logic level (1 or 0) of the analog input signal Vin. The latch LDk performs a magnitude comparison between the reference voltage Vref and the analog input signal Vin based on the output of the preamplifier PDk coupled thereto to judge the digital logic level. The clock signal φC and a calibration end instruction signal φSDk are supplied as control signals to the latch LDk. The calibration end instruction signal φSDk is a signal instructing the end of the calibration.

The signal φrdm output from a random number generating circuit 115 is supplied to the flip-flops 111 to 114. The flip-flops 111 to 114 operate by using the signal φrdm as a clock signal and output calibration end instruction signals φSDk.

More specifically, in the case that calibration is performed in the direction of the arrangement of the preamplifiers, PD4, PD3, PD2, PD1, the output of a flip-flop 114 is input to a flip-flop 113 and also supplied to the latch LD3 as the calibration end instruction signal φSD3 as shown in FIG. 20. The output of the flip-flop 113 is input to a flip-flop 112 and also supplied to the latch LD2 as the calibration end instruction signal φSD2. Similarly, the output of the flip-flop 112 is input to a flip-flop 111 and also supplied to the latch LD1 as the calibration end instruction signal φSD1.

In the case that calibration is performed in the direction of the arrangement of the preamplifiers, PD1, PD2, PD3, PD4, the output of the flip-flop 111 is input to the flip-flop 112 and also supplied to the latch LD2 as the calibration end instruction signal φSD2, although this is not shown. The output of the flip-flop 112 is input to the flip-flop 113 and also supplied to the latch LD3 as the calibration end instruction signal φSD3. Similarly, the output of the flip-flop 113 is input to the flip-flop 114 and also supplied to the latch LD4 as the calibration end instruction signal φSD4.

The random number generating circuit 115 operates based on the clock signal φC, and generates a random number and outputs the signal φrdm depending on the generated random number. The random number generating circuit 115 generates a random number, for example, so that the number of cycles of calibration is larger than the minimum number of cycles to compensate for fluctuations due to leakage or the like caused during the interval period from the execution of calibration to the execution of the next calibration. For example, a random number table (random number list) or a random number generating logic (circuit) may also be used to generate random numbers in the random number generating circuit 115.

In the state depicted in FIG. 20, calibration is performed in the direction of the arrangement of the preamplifiers, PD4, PD3, PD2, PD1, and the preamplifier PD3 and the latch LD3 are performing calibration and the other preamplifiers and the other latches are performing normal operation.

The operation of the parallel A/D converter shown in FIG. 20 will be described below. Since the calibration operation and the normal operation at each comparator (preamplifier and latch) of the parallel A/D converter in FIG. 20 are similar to those at each comparator of the parallel A/D converter in FIG. 13, their detailed descriptions are omitted.

Figure 21:
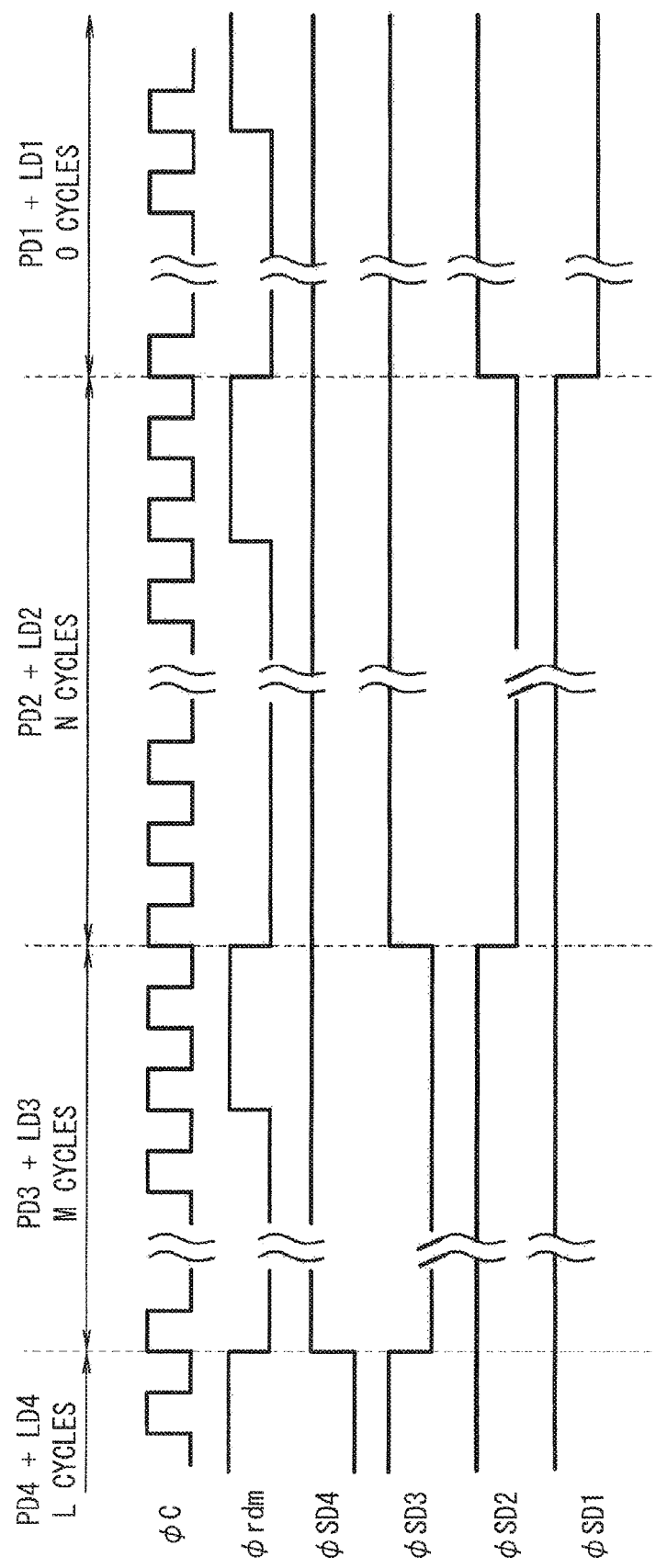
FIG. 21 illustrates a timing chart showing the operation of the third embodiment in FIG. 20.

The switching of the circuit that performs calibration will be described below referring to FIG. 21. FIG. 21 is a timing chart showing an operation example of the parallel A/D converter illustrated in FIG. 20.

As shown in FIG. 21, the signal φrdm output from the random number generating circuit 115 is changed in synchronization with the rising edge of the clock signal φC. The calibration end instruction signal φSDk is changed in synchronization with the falling edge of the signal ϕrdm. The number of cycles between the falling edges of the signal ϕrdm is changed randomly depending on the random number generated using the random number generating circuit 115. Hence, the switching of the comparator for performing calibration in the parallel A/D converter is done randomly instead of every constant number of cycles. As a result, the spurious generating frequency is distributed, and the characteristics are improved.

As shown in FIG. 21, for example, the calibration end instruction signal ϕSD3 becomes L, and calibration is started at the preamplifier PD3 and the latch LD3. The signal ϕrdm falls M cycles after the start of the calibration. Hence, the calibration end instruction signal ϕSD3 becomes H and the calibration end instruction signal ϕSD2 becomes L, and calibration is started at the preamplifier PD2 and the latch LD2. Furthermore, the signal ϕrdm falls N cycles after the start of the calibration, whereby the calibration end instruction signal ϕSD2 becomes H and the calibration end instruction signal ϕSD1 becomes L. Hence, the calibration at the preamplifier PD2 and the latch LD2 is ended, and the calibration at the preamplifier PD1 and the latch LD1 is started. Similarly, the state is shifted to the next state each time the signal ϕrdm falls, and the next calibration is started.

In the aforementioned embodiments, although the calibration control circuit for judging the end of calibration is illustrated so as to be provided separately from the corresponding latch, the calibration control circuit may be included inside the latch. In addition, although the calibration control circuit is configured so that the outputs at the different timing of the corresponding latch are obtained using two flip-flops, the configuration is not limited to this configuration. Since the output of the latch may be obtained by differing the delay time, the configuration may be modified.

According to the aforementioned embodiments, in the case that the first calibrator judges that the calibration of the first judgment value has been ended according to the result of a comparison between the first signal and the second signal, the calibration at the first calibrator is ended, and the calibration at the second calibrator is started. Consequently, the target of calibration is switched at random time intervals depending on the calibration at each calibrator.

It is noted that embodiment numbers (first, second or third etc.) do not show priorities of the embodiments. Many variations and modifications will be apparent to those skilled in the art.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
a first comparator for judging the level of an input signal based on a first judgment value;
a second comparator for judging the level of the input signal based on a second judgment value;
a first calibrator for calibrating the first judgment value; and
a second calibrator for calibrating the second judgment value;
wherein the first calibrator outputs a control signal for starting calibration in the second calibrator in the case that the calibration of the first judgment value is ended.

2. The semiconductor device according to claim 1,
wherein the first calibrator compares a first signal output from the first comparator with a second signal output from the first comparator with timing different from that of the first signal and judges that the calibration of the first judgment value is ended based on the result of the comparison.

3. The semiconductor device according to claim 2,
wherein the first calibrator judges that the calibration of the first judgment value is ended when the level of the first signal is different from the level of the second signal.

4. The semiconductor device according to claim 1,
wherein the second comparator performs judgment operation in case that the first calibrator performs calibration operation.

5. The semiconductor device according to claim 1,
wherein the first calibrator has multiple calibration accuracies relating to the calibration of the first judgment value.

6. The semiconductor device according to claim 5,
wherein the first calibrator sequentially perform coarse adjustment calibration and fine adjustment calibration to calibrate the first judgment value.

7. The semiconductor device according to claim 1,
wherein the first calibrator comprises a first delay section for outputting the first signal obtained by delaying the output signal of the first comparator by a first delay time and a second delay section for outputting the second signal obtained with by delaying the output signal by a second delay time different from the first delay time.

8. The semiconductor device according to claim 7,
wherein each of the first delay section and the second delay section has a flip-flop, and the flip-flop of the first delay section and the flip-flop of the second delay section are coupled in series.

9. A control method of determining the level of a signal, the method comprising:
starting a calibration of a first judgment value for judging the level of the signal,
comparing a first signal based on the calibration of the first judgment value with a second signal that has timing different from that of the first signal, and
starting calibration of a second judgment value for judging the level in a case that an end of the calibration of the first judgment value is judged based on a result of the comparison between the first signal and the second signal.

* * * * *